US008043971B2

(12) United States Patent
Sasaki et al.

(10) Patent No.: US 8,043,971 B2
(45) Date of Patent: Oct. 25, 2011

(54) PLASMA PROCESSING APPARATUS, RING MEMBER AND PLASMA PROCESSING METHOD

(75) Inventors: Yasuharu Sasaki, Nirasaki (JP);
Tsuyoshi Moriya, Nirasaki (JP);
Hiroshi Nagaike, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 342 days.

(21) Appl. No.: 12/340,256

(22) Filed: Dec. 19, 2008

(65) Prior Publication Data

US 2009/0104781 A1    Apr. 23, 2009

Related U.S. Application Data

(63) Continuation of application No. 10/773,245, filed on Feb. 9, 2004, now abandoned.

(30) Foreign Application Priority Data

Feb. 7, 2003 (JP) ................................ 2003-031278
Nov. 28, 2003 (JP) ................................ 2003-398334

(51) Int. Cl.
*H01L 21/302* (2006.01)
(52) U.S. Cl. ........ 438/714; 438/710; 438/712; 438/729; 156/345.44
(58) Field of Classification Search .................. 438/706, 438/710, 712, 714, 729; 156/345.44, 45, 156/345.47
See application file for complete search history.

(56) References Cited

U.S. PATENT DOCUMENTS

| 4,357,387 | A |   | 11/1982 | George et al. |
| 5,716,486 | A |   | 2/1998 | Selwyn et al. |
| 5,897,752 | A |   | 4/1999 | Hong et al. |
| 5,925,228 | A | * | 7/1999 | Panitz et al. ................ 204/484 |
| 5,942,039 | A |   | 8/1999 | Kholodenko et al. |
| 6,284,149 | B1 | * | 9/2001 | Li et al. ......................... 216/64 |

(Continued)

FOREIGN PATENT DOCUMENTS

EP    1 286 382 A2    2/2003

(Continued)

OTHER PUBLICATIONS

Office Action issued Jan. 31, 2011, in Taiwanese Patent Application No. 093102927 with English translation.

*Primary Examiner* — Lan Vinh
(74) *Attorney, Agent, or Firm* — Oblon, Spivak, McClelland, Maier & Neustadt, L.L.P.

(57) ABSTRACT

[Problem to be Solved] In a plasma processing apparatus for executing a process using plasma, promoting the sharing of an apparatus in executing a plurality of different processes and plasma states amongst apparatuses in executing same processes in a plurality of apparatuses are provided.
[Solution] A ring member formed of an insulating material is disposed to surround a to-be-treated substrate in a processing vessel and an electrode is installed in the ring member for adjusting a plasma sheath region. For example, a first DC voltage is applied to the electrode when a first process is performed on the to-be-treated substrate and a second DC voltage is applied to the electrode when a second process is performed on the to-be-treated substrate. In this case, the plasma state can be matched by applying an appropriate DC voltage according to each process or each apparatus executing the same process. Therefore, the sharing of an apparatus can be promoted and the plasma state can be readily adjusted.

18 Claims, 20 Drawing Sheets

U.S. PATENT DOCUMENTS

| | | |
|---|---|---|
| 6,363,882 B1 | 4/2002 | Hao et al. |
| 6,726,799 B2 | 4/2004 | Koike |
| 6,771,483 B2 * | 8/2004 | Harada et al. ............... 361/234 |
| 7,311,797 B2 * | 12/2007 | O'Donnell et al. ...... 156/345.51 |
| 2001/0003271 A1 | 6/2001 | Otsuki |
| 2002/0020494 A1 | 2/2002 | Yokogawa et al. |
| 2003/0007308 A1 | 1/2003 | Harada et al. |
| 2003/0019582 A1 * | 1/2003 | Drewery ................. 156/345.43 |
| 2003/0113479 A1 * | 6/2003 | Fukuda et al. ............... 427/569 |
| 2004/0002221 A1 | 1/2004 | O'Donnell et al. |
| 2004/0081746 A1 | 4/2004 | Imafuku |
| 2004/0177927 A1 | 9/2004 | Kikuchi et al. |
| 2006/0048894 A1 | 3/2006 | Yamazaki et al. |

FOREIGN PATENT DOCUMENTS

| | | |
|---|---|---|
| JP | 4-279044 | 10/1992 |
| JP | 5-70922 | 3/1993 |
| JP | 6-11346 | 2/1994 |
| JP | 9-75832 | 3/1997 |
| JP | 9-298190 | 11/1997 |
| JP | 10-277707 | 10/1998 |
| JP | 2000-164570 | 6/2000 |
| JP | 2000-164583 | 6/2000 |
| JP | 2001-203258 | 7/2001 |
| JP | 2001-226773 | 8/2001 |
| JP | 2002-88462 | 3/2002 |
| JP | 2002-190472 | 7/2002 |
| JP | 2002-228803 | 8/2002 |
| WO | WO 02/48421 A1 | 6/2002 |
| WO | WO 02/079538 A1 | 10/2002 |
| WO | WO 03/009363 A1 | 1/2003 |

* cited by examiner

PLASMA PROCESSING APPARATUS, RING MEMBER AND PLASMA PROCESSING METHOD

CROSS REFERENCE

This application is a continuation of pending U.S. application Ser. No. 10/773,245 filed on Feb. 9, 2004, which claims priority to Japanese Application Nos. 2003-031278, filed Feb. 7, 2003 and 2003-398334, filed Nov. 28, 2003, the entire disclosure of Ser. No. 10/773,245 is incorporated by reference.

FIELD OF THE INVENTION

The present invention relates to a plasma processing apparatus for performing a process such as an etching process on a substrate, e.g., a semiconductor wafer, by using plasma.

BACKGROUND OF THE INVENTION

In manufacturing processes of a semiconductor device, conventionally, dry etching has been performed on a substrate such as a semiconductor wafer (hereinafter, referred to as a wafer) for, e.g., separating capacitors or elements, or forming contact holes. A single sheet parallel plate type plasma processing apparatus is known as an apparatus performing such a process (see, e.g., reference patents 1 and 2).

The above-mentioned apparatus will be described briefly with reference to FIG. 28. The plasma apparatus includes an upper electrode 11 serving also as a gas shower head and a lower electrode 12 serving also as a mounting table at an upper side and lower side of an airtight vessel 1, respectively. Further, a silicon ring 13 at an inner side and a quartz ring 14 at an outer side are installed to surround the wafer W on the mounting table 12. The wafer on the mounting table (the lower electrode) is etched by applying a bias voltage to the lower electrode 12 from a high frequency power supply 16 and performing vacuum exhaust through a gas exhaust port 17 to keep a predetermined pressure, while, at the same time, a high frequency voltage is applied between the upper and lower electrodes 11 and 12 by a high frequency power supply 15; and a processing gas from the gas shower head (the upper electrode) 11 is converted into plasma.

Functions of the silicon ring 13 and the quartz ring 14 will hereinafter be described. The processing gas arriving at the proximity of the surface of the wafer W is diffused toward the periphery of the wafer W and exhausted from outside the periphery toward the bottom. Therefore, a gas flow of the processing gas at the peripheral portion (around the periphery) of the wafer W is different from that at the central portion of the wafer W, disturbing a balance of a predetermined composition in the processing gas at the peripheral portion of the wafer W. Further, the component of impedance, conductance or the like between the plasma and the lower electrode at an area on which the wafer W is disposed differs from those at outside the area, respectively. As a result, the plasma state above a nearby area of the wafer's periphery is different from that above inside of the wafer's periphery.

On the other hand, high in-surface uniformity of an etching rate needs to be achieved because of a strong need to form devices even in the area close to the periphery of wafer W in order to increase utilization. Accordingly, a ring member (referred to as a focus ring or the like) formed of a conductor, semiconductor or dielectric substance is disposed outside the wafer W to adjust the plasma density above the peripheral portion of the wafer W. Specifically, a focus ring material is selected; and width, height or the like of the ring is adjusted according to the material of a to-be-etched film, the magnitude of a supply power or the like when installing a focus ring suitable for the process (see, e.g., reference patent 3).

As one example in the above-mentioned reference patents, a silicon ring is used when etching a silicon oxide film, and, for example, an insulator, such as quartz or the like, is used when etching polysilicon.

reference patent 1: Japanese Patent Laid-Open Publication No. 8-335568 (pages 3-4, FIG. 2)
reference patent 2: Japanese Patent Laid-Open Publication No. 2000-36490 (page 5, FIG. 3)
reference patent 3: Japanese Patent Laid-Open Publication No. 8-162444 (page 5, FIG. 2)

Problems to be Solved by the Invention

From the above, in case of etching multi-layers formed on the wafer W, different focus rings are required because processing gases, magnitudes of supply powers or the like vary for each layer or between some of the layers, and as many chambers need to be fabricated as the number of different focus rings. Practically, for example, in order to etch a five-layer film, one chamber is shared for two films and different chambers are used for the other films. It is desirable to share a chamber since fundamental components are identical in etching apparatuses even if etched films are different, but the above reason prevents the sharing of a chamber.

This becomes one factor that makes it difficult to reduce a footprint (an area occupied by an apparatus), and increases the cost of manufacturing and operating etching apparatuses with respect to mass production and management because it increases variations in apparatuses.

The present invention is made under such circumstances. It is, therefore, an object of the present invention to provide an apparatus and method for plasma processing to promote the sharing of an apparatus in executing a plurality of different processes. Another object is to provide a plasma processing apparatus capable of easily adjusting a plasma state between apparatuses executing same processes.

Solution

In accordance with the present invention, there is provided a plasma processing apparatus for performing a processing on a to-be-treated substrate mounted on a mounting table in a processing vessel by plasma of a processing gas, including: a ring member formed of an insulating material and installed to surround the to-be-treated substrate on the mounting table; one or more electrodes installed in the ring member; and a DC power supply for applying a DC voltage to the one or more electrodes to adjust a plasma sheath region above the ring member.

In accordance with a plasma processing apparatus of the present invention, since a specified DC voltage is applied to an electrode in the ring member formed of an insulator, thickness of the ion sheath region at a boundary between the surface of the ring member and plasma state can be adjusted in each processing treatment. As a result, a common ring member can be used for a plurality of different processings, thus promoting the sharing of an apparatus.

Further, the plasma processing apparatus of the present invention may be provided with a means for varying the applied voltage such that a first DC voltage is applied to the one or more electrodes when a first process is performed on the to-be-treated substrate and a second DC voltage is applied to the one or more electrodes when a second process is performed on the to-be-treated substrate. In this case, the means may be provided with a storage area storing process conditions for executing, e.g., the first process and a second process on the to-be-treated substrate, and the applied voltage may be converted with reference to data in the storage area. Furthermore, the first process, for example, is etching of a thin film and the second process, for example, is etching of another thin film which is different from the thin film in the first process. Still further, the one or more electrodes in the ring member are installed along a diametrical direction and respective DC voltages applied to the one or more electrodes are adjusted independently.

In accordance with another invention, there is provided with a ring member in a plasma processing apparatus for performing a processing on a to-be-treated substrate mounted on a mounting table in a processing vessel by a plasma of a processing gas, wherein the ring member is formed of an insulating material and installed to surround the to-be-treated substrate on the mounting table, wherein the ring member includes: one or more electrodes, installed in the ring member, to each of which a DC voltage is applied to adjust a plasma sheath region above the ring member.

In the ring member, for example, a first DC voltage is applied to the one or more electrodes when a first process is performed on the to-be-treated substrate and a second DC voltage is applied to the one or more electrodes when a second process is performed on the to-be-treated substrate. In this case, the first process is etching of a thin film and the second process is etching of another thin film from which is different from the thin film in the first process. Further, the one or more electrodes in the ring member are installed along a diametrical direction and respective DC voltages applied to the one or more electrodes are adjusted independently.

A plasma processing method of the present invention includes the steps of: mounting a to-be-treated substrate on a mounting table in a processing vessel; executing a first process on the to-be-treated substrate by generating plasma in a processing vessel under a condition in which a first DC voltage is applied to an electrode for adjusting a plasma sheath region, which is installed in a ring member formed of an insulating material and installed to surround the to-be-treated substrate on the mounting table; and executing a second process on the to-be-treated substrate by generating plasma in the processing vessel under a condition in which a second DC voltage is applied to the electrode for adjusting the plasma sheath region.

Further, in accordance with a first aspect of the present invention, there is provided a ring member including: a base material; and a film formed by thermal spraying of ceramic on a surface of the base material, wherein the film is formed of ceramic including at least one kind of element selected from the group consisting of B, Mg, Al, Si, Ca, Cr, Y, Zr, Ta, Ce and Nd, and at least a portion of the film is sealed by a resin.

In accordance with a second aspect of the present invention, there is provided a ring member including: a base material; and a film formed by thermal spraying of ceramic on a surface of the base material, wherein the film has a first ceramic layer formed of ceramic including at least one kind of element selected from the group consisting of B, Mg, Al, Si, Ca, Cr, Y, Zr, Ta, Ce and Nd and a second ceramic layer formed of ceramic including at least one kind of element selected from the group consisting of B, Mg, Al, Si, Ca, Cr, Y, Zr, Ta, Ce and Nd, and at least a portion of at least one of the first and the second ceramic layer is sealed by a resin.

According to the first and second aspects of the present invention, it is preferable that the resin is selected from the group consisting of SI, PTFE, PI, PAI, PEI, PBI and PFA.

In accordance with a third aspect of the present invention, there is provided the ring member including a ring member including: a base material; and a film formed by thermal spraying of ceramic on a surface of the base material, wherein the film is formed of ceramic including at least one kind of element selected from the group consisting of B, Mg, Al, Si, Ca, Cr, Y, Zr, Ta, Ce and Nd, and at least a portion of the film is sealed by a sol-gel method.

In accordance with a fourth aspect of the present invention, there is provided a ring member, including: a base material; and a film formed by thermal spraying of ceramic on a surface of the base material, wherein the film has a first ceramic layer formed of ceramic including at least one kind of element selected from the group consisting of B, Mg, Al, Si, Ca, Cr, Y, Zr, Ta, Ce and Nd, and a second ceramic layer formed of ceramic including at least one kind of element selected from the group consisting of B, Mg, Al, Si, Ca, Cr, Y, Zr, Ta, Ce and Nd, and at least a portion of at least one of the first and the second ceramic layer is sealed by a sol-gel method.

According to the third and fourth aspects of the present invention, it is preferable that a sealing treatment is executed by using an element selected from elements in the Group 3a of the periodic table.

According to the first to fourth aspects of the present invention, the ceramic is at least one kind selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

In accordance with a fifth aspect of the present invention, there is provided a ring member including: a base material; and a film formed on a surface of the base material, wherein the film has a main layer formed by thermal spraying of ceramic and a barrier coat layer formed of ceramic including an element selected from the group consisting of B, Mg, Al, Si, Ca, Cr, Y, Zr, Ta, Ce and Nd.

According to the fifth aspect of the present invention, the barrier coat layer is formed of at least one kind of ceramic selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. Further, it is preferable that the barrier coat layer is a thermally sprayed film at least a portion of which is sealed by a resin, and that the resin is selected from the group consisting of SI, PTFE, PI, PAI, PEI, PBI and PFA. Furthermore, it is preferable that the barrier coat layer is a thermally sprayed film at least a portion of which is sealed by a sol-gel method, and that a sealing treatment is performed by using an element selected from elements in the Group 3a of the periodic table.

In accordance with a sixth aspect of the present invention, there is provided the ring member including: a base material; and a film formed on a surface of the base material, wherein the film has a main layer formed by thermal spraying of ceramic and a barrier coat layer formed of engineering plastic between the base material and the main layer.

According to the sixth aspect of the present invention, the engineering plastic is a plastic selected from the group consisting of PTFE, PI, PAI, PEI, PBI, PFA, PPS, and POM.

According to the fifth and sixth aspects of the present invention, the main layer is formed of at least one kind of ceramic selected from the group consisting of $B_4C$, $MgO$, $Al_2O_3$, $SiC$, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

In accordance with a seventh aspect of the present invention, there is provided a ring member including: a base material; and a film formed on a surface of the base material, wherein the film is formed of ceramic having at least one kind of element in the Group 3A of the periodic table and at least a portion of the film is hydrated by vapor or high temperature hot water.

In accordance with an eighth aspect of the present invention, there is provided the ring member including: a base material; and a film formed on a surface of the base material, wherein the film has a first ceramic layer formed of ceramic including at least one kind of element in the Group 3a of the periodic table and a second ceramic layer formed of ceramic including at least one kind of element in the Group 3a of the periodic table, and at least a portion of at least one of the first and the second ceramic layers is hydrated by vapor or high temperature hot water.

According to the seventh and eighth aspects of the present invention, the film is a thermally sprayed film formed by thermal spraying or a thin film formed by a thin film formation technique. Further, it is preferable that the film is formed of ceramic selected from $Y_2O_3$, $CeO_2$, $Ce_2O_3$ and $Nd_2O_3$.

In accordance with a ninth aspect of the present invention, there is provided the ring member including: a base material; and a film formed on a surface of the base material, wherein the film has a first ceramic layer formed of ceramic including at least one kind of element in the Group 3a of the periodic table and a second ceramic layer formed by thermal spraying of ceramic, and at least a portion of the first ceramic layer is hydrated by vapor or high temperature hot water.

According to the ninth aspect of the present invention, the first ceramic layer is a thermally sprayed film formed by thermal spraying or a thin film formed by a thin film formation technique. Further, it is preferable that the first ceramic layer is formed of ceramic selected from the group consisting of $Y_2O_3$, $CeO_2$, $Ce_2O_3$ and $Nd_2O_3$. Furthermore, it is preferable that the second ceramic layer is formed of at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

In accordance with a tenth aspect of the present invention, there is provided the ring member including: a base material; and a film formed on a surface of the base material, wherein the film has a hydroxide layer formed of hydroxide including at least one kind of element in the Group 3a of the periodic table a base material and a film formed by spraying ceramic on the surface of the base material, wherein the film has a hydroxide layer formed of a hydroxide including at least one element of the Group 3A of the Periodic table.

According to the tenth aspect of the present invention, the hydroxide layer is a thermally sprayed film formed by thermal spraying or a thin film formed by a thin film formation technique. Further, it is preferable that the hydroxide layer is formed of hydroxide selected from $Y(OH)_3$, $Ce(OH)_3$ and $Nd(OH)_3$. Furthermore, at least a portion of the hydroxide layer is sealed.

According to the first to tenth aspects of the present invention, an anodic oxidized film is formed between the base material and the film, and in this case, it is preferable that the anodic oxidized film is sealed by an aqueous solution of metal salt. Further, the anodic oxidized film may be sealed by a resin selected from the group consisting of SI, PTFE, PI, PAI, PEI, PBI and PFA.

In accordance with an eleventh aspect of the present invention, there is provided a ring member formed of a sintered ceramic body including at least one kind of element in the Group 3a of the periodic table, and at least a portion of the sintered ceramic body is hydrated by vapor or high temperature hot water. In this case, it is preferable that the sintered ceramic body is formed by hydrating ceramic selected from the group consisting of $Y_2O_3$, $CeO_2$, $Ce_2O_3$ and $Nd_2O_3$.

In accordance with a twelfth aspect of the present invention, there is provided the ring member formed of a sintered ceramic body including a hydroxide having at least one kind of element in the Group 3a of the periodic table. In this case, it is preferable that the hydroxide included in the sintered ceramic body is selected from the group consisting of $Y(OH)_3$, $Ce(OH)_3$ and $Nd(OH)_3$.

Effect of the Invention

In accordance with the present invention, the sharing of an apparatus can be promoted in a plurality of different processes by applying a specified DC voltage to an electrode in a ring member formed of an insulator. Further, for example, when the same process is executed by using a plurality of the processing vessels, the adjustment of matching plasma states between these apparatuses can be performed easily by setting the DC voltage applied to each electrode as a variable.

Additionally, in accordance with the present invention, in the ring member of a structure having a base material and a film formed by thermal spraying, peeling off of the film formed by thermal spraying can be suppressed as the surface of the base material is not exposed to the processing gas or the cleaning fluid given that several layers function as a barrier.

Moreover, in accordance with the present invention, the ring member almost without a release of water in plasma process is provided, because it can have the structure almost without adsorption and release of water by performing the hydration treatment on the ceramic, including at least one element of the Group 3a of the periodic table, or forming the layer or sintered body having the hydroxide including at least one element of the Group 3a of the periodic table.

DETAILED DESCRIPTION OF THE PREFERRED EMBODIMENTS

An embodiment of a plasma processing apparatus in accordance with the present invention is described with reference to FIG. 1. Reference numeral 2 refers to an airtight processing vessel formed of a conductive material, e.g., aluminum, and the processing vessel 2 is grounded. In the processing vessel 2, an upper electrode 3 serving also as a gas shower head, i.e., a gas supply unit for introducing a predetermined processing gas such as an etching gas, is disposed to face a lower electrode 4 serving also as a mounting table for mounting a to-be-processed substrate, e.g., a wafer W, thereon. Further, a gas exhaust port 21 is installed at the bottom portion of the processing vessel 2, and a vacuum exhaust unit, i.e., a vacuum pump 22 such as a turbo molecular pump or a dry pump, is connected to the gas exhaust port 21 via a gas exhaust line 21a. Furthermore, an opening 24 for loading/unloading the wafer W is formed at the sidewall portion of the processing vessel 2 and it can be opened or closed by a gate valve 23.

At the bottom surface side of the upper electrode 3, a number of gas diffusion holes 31 are formed to face the wafer W mounted on the lower electrode 4 and configured to supply uniformly a processing gas therethrough from an upper gas supply line 32 on the surface of the wafer W. Further, the gas supply line 32 is connected at its end to a first gas supplying system 33 for supplying a first processing gas and a second gas supplying system 34 for supplying a second processing gas different from the first gas, and either the first gas supplying system 33 or the second gas supplying system 34 may be selected to supply the processing gas, for example, by opening/closing operation of valves (not shown). The first and second gas supplying systems 33 and 34 set forth herein are intended to supply the first processing gas for executing a first process and the second processing gas for executing a second process, respectively, and the first processing gas (the second processing gas) may represent one or more kind of gases. Furthermore, the only one gas supply line 32 is shown for simplicity, but a number of gas supply lines may be installed in practice, if necessary.

In addition, the upper electrode 3 is connected to a high frequency power supply 36 for supplying a power with a frequency of, e.g., 60 MHz via a low-pass filter 35. Further, an annular quartz shield ring 37 is inserted surrounding the upper electrode 3 along the outer peripheral portion of the upper electrode 3.

The lower electrode 4 is connected via a high-pass filter 40 to a high frequency power supply 41 for applying a bias voltage with a frequency of, e.g., 2 MHz. Further, the lower electrode 4 is disposed on an elevating mechanism 42 installed at the bottom portion of the processing vessel 2 so that the lower electrode 4 can be elevated and lowered by the elevating mechanism 42. Furthermore, a reference numeral 43 refers to a bellows for preventing plasma from getting under the lower electrode 4. Further, an electrostatic chuck 44 for attracting and holding the rear surface of a wafer W by means of electrostatic force is installed on the upper surface of the lower electrode 4. The electrostatic chuck 44 includes a sheet-shaped chuck electrode 45; an insulating layer 46 which covers a surface of the chuck electrode 45 and is formed of, e.g., polyamide; and a DC power supply 47 for applying a chuck voltage to the chuck electrode 45. Further, an annular base plate (not shown) formed of an insulation member such as quartz is installed around the lower electrode 4 to protect the electrode against plasma.

Further, a temperature control unit for controlling the wafer W to have a predetermined temperature is installed in the lower electrode 4. The temperature control unit is intended to regulate the temperature of the wafer W through a rear surface side by means of a coolant passageway 48, a coolant, a gas supply unit, a heat transfer gas and the like. To be more specific, the coolant passageway 48 are installed in the lower electrode 4, and the coolant circulates in the coolant passageway 48 and an external coolant temperature control unit (not shown). Furthermore, in a vacuum atmosphere, formed on the surface of the electrostatic chuck 44 are gas supply holes (not shown) for purging the heat transfer gas (referred to as a backside gas and the like) such as a helium gas through a very small gap (a space formed by irregularities due to the limit of processing precision on the surface) between the surface of the electrostatic chuck 44 and the rear surface of the wafer W, and the gas supply holes are connected to, e.g., a gas supply unit (not shown).

Moreover, around the electrostatic chuck 44, a focus ring 5, i.e., a ring member made of an insulating material selected from alumina, quartz, yttrium oxide and the like, is installed to surround the periphery of the wafer W attracted and held by the electrostatic chuck 44. The width of focus ring 5 is set to, e.g., 50 mm. It is preferable that the focus ring 5 is installed as close to the outer periphery of the wafer W as possible. For example, the focus ring 5 is installed such that it is, e.g., not more than 2 mm, preferably 1 mm, spaced from the outer periphery of the wafer W. Further, an electrode 51 having a shape of, e.g., ring, and being made of e.g., a metal foil such as Mo, Al or the like or a tungsten film, is embedded in the focus ring 5 along its circumference. Furthermore, the electrode 51 is connected to a DC power supply 52 with an actuator 52a for converting applied voltages in such a way as to apply a predetermined voltage to the electrode 51 in each process, for example, apply a first DC voltage in a first process and a second DC voltage to the electrode 51 in a second process. The focus ring 5 diffuses plasma which is apt to be condensed, e.g., at and around the periphery of the wafer W, so that it improves uniformity of plasma headed for the wafer W.

Hereinafter, a method for manufacturing the focus ring 5 will be described briefly, and the present invention is not limited by the manufacturing method. For example, the electrode 51 is first formed by forming a metal foil by means of screen printing, film-formation or the like, or by laying a meshed metal member on a surface of, e.g., a ring-shaped quartz and then the focus ring 5 is obtained by adhering or welding a thin plate of quartz on the electrode 51 thereto, or performing thermal straying of yttrium oxide or the like on the electrode 51. As another method, a different metal powder which is put on the surface of, e.g., ring-shaped alumina, is, for example, pressed to be hardened, forming the electrode 51 and an alumina powder is put thereon and sintered to form the focus ring 5.

Additionally, a reference numeral 6 of FIG. 1 refers to a controller. The controller 6 has a function to control the operations of the aforementioned high frequency power supply 36, a high frequency power supply 41, the actuator 52a, the first gas supplying system 33, and the second gas supplying system 34. A control function of the controller 6 will be described again with reference to FIG. 2. The controller 6 is provided with a computer 60, and a plurality of process recipes are stored in a storage area 61 of the computer 60. Stored in the process recipes are process conditions corresponding to, e.g., kinds of films to be processed on the surface of a wafer W, i.e., information of set values such as an voltage applied to the electrode 51, a process pressure, a temperature of the wafer W, kinds of processing gases, and a supply flow rate of a processing gas. A reference numeral 62 refers to a recipe selecting unit 62 which allows, e.g., an operator to select a process recipe corresponding to the kind of to-be-treated film. For example, when films with different process conditions are on the surface of the wafer W, the first and the second processes are determined depending on a combination and kinds of the films, and the process recipes corresponding to the first and the second processes are selected by the recipe selecting unit 62. Further, for simplicity, only the first and the second processes are shown, the process recipes may be prepared corresponding to a third process, a fourth process, or the like as required, and in this case, process conditions such as the voltage applied to the electrode 51 are determined for each process. And, based on information of a selected process recipe, the actuator 52a is controlled to apply a predetermined DC voltage to the electrode 51, and the first and the second gas supplying system 33 and 34 are controlled during supplying operations to introduce a predetermined processing gas into the processing vessel 2 with a predetermined flow rate. Moreover, reference numerals 63 and B refer to a CPU and a bus, respectively.

A process of adjusting states of plasma by applying a DC voltage to the electrode 51 of the focus ring 5 will be described with reference to FIGS. 3A to 3D. First, when a DC voltage is not applied to the electrode 51 and a processing gas in the processing vessel 2 is converted into a plasma as shown FIG. 3A, an ion sheath region (a plasma sheath region) including high-density positive ion species 200 is formed at a boundary between the surface of the wafer W and the plasma P due to higher velocities of electrons compared with those of positive ion species. Further, an ion sheath region is also formed at a boundary between the surface of the focus ring 5 and the plasma P in the same manner, and is thicker than the ion sheath region on the surface of the wafer W because the focus ring 5 is made of an insulating material. The ion sheath region on the surface of the focus ring 5 are formed with various shapes according to the shapes, material and the like of the focus ring 5. As described above, when the ion sheath regions are different in thickness, there is a difference of the plasma density in the surface of the wafer W, particularly, between the peripheral portion thereof and the central portion thereof. However, for example, when a positive DC voltage is applied to the electrode 51 embedded in the focus ring 5, a repulsive force whose magnitude is suitable for the applied voltage acts between the positive ion species 200 and the electrode 51, so that the positive ion species 200 in the ion sheath region are returned into the plasma P, changing the ion sheath region in shape, especially, in thickness. As a result, the plasma density is changed.

To be more specific, for example, when the DC voltage applied to the electrode 51 is low as shown in FIG. 3B, a small number of positive ion species 200 are returned to the plasma P, making the ion sheath region thick, so that the plasma P around the peripheral portion of the wafer W has higher density than that of the center portion of the wafer W. On the other hand, when the DC voltage applied to the electrode 51 is high as shown in FIG. 3C, positive ion species 200 are returned to the plasma P making the ion sheath region thinner, so that the density of the plasma P around the periphery portion of the wafer W becomes lower when compared with the plasma density around the peripheral portion of the wafer W in FIG. 3B. Further, when the DC voltage applied to the electrode 51 is still higher as shown in FIG. 3D, the ion sheath region becomes still thinner than that on the wafer W. Therefore, the state of the plasma P eventually becomes adjusted if a predetermined DC voltage is applied to the electrode 51. However, how to set the practically applied DC voltage for an in-surface uniform treatment of the wafer W depends on a kind of film to be etched, supply powers applied to the electrodes 3 and 4, and the like. Therefore, it is preferable to determine set values for each process in advance by way of experiments. Further, a negative voltage may be applied to the electrode 51.

Hereinafter, a method for processing the wafer W as a to-be-treated substrate by using the above-mentioned plasma processing apparatus is described. As an example for processing processes which are different from each other, an example of etching a wafer W with a silicon nitride film 65 deposited on a base film of a silicon film 64 is described as shown in FIG. 4A, wherein the silicon nitride film has different processing conditions from those of the silicon film. In this example, a first process is a process of etching an upper silicon nitride film 65 as shown in FIG. 4B, and a second process following the first process is a process of etching a lower silicon film 64 as shown in FIG. 4C. And process recipes corresponding to these processes are selected by the recipe selecting unit 62 and the process conditions are set based on information of the selected process recipe.

First, the wafer W is loaded into the processing vessel 2 from a load-lock chamber (not shown) after the gate valve 23 is opened. Thereafter the wafer W is mounted on the electrostatic chuck 44 of the lower electrode 4 via substrate elevating pins (not shown). Then, the gate valve 23 is closed to make the processing vessel 2 airtight. Subsequently, the elevating mechanism 42 is raised, so that the surface of the wafer W is set at a predetermined height with respect to the upper electrode 3. On the other hand, the surface of the lower electrode 4 is set at a predetermined temperature since a coolant circulates in the coolant passageway 50. And when the wafer W is adsorbed and held to the surface of the lower electrode 4, a heat transfer gas from the gas supply holes 51 is supplied into the very small gap between the surface of the lower electrode 4 and the rear surface of the wafer W. Therefore, the wafer W is controlled to be kept at a predetermined temperature by balancing of heat of the gas and heat transferred from plasma to the wafer W upon generation of plasma as described below.

Additionally, the processing vessel 2 is exhausted to a vacuum state by the vacuum pump 22 while the first etching gas such as $CHF_3$ or the like with a given flow rate is introduced thereto from the first gas supplying system 33 through the gas supply line 32 and sprayed uniformly on the surface of the wafer W through the gas diffusion holes 31. So, the processing vessel 2 is maintained at a vacuum level of, e.g., from 30 to 100 mTorr (approximately, 4 to 13.3 Pa). The first etching gas forms an air flow flowing on the surface of the wafer W outward along a diametrical direction, and is exhausted uniformly from the periphery of the lower electrode 4.

Moreover, the first DC voltage, e.g., 1000V, is applied to the electrode 51. At the same time, a voltage with a high frequency of, e.g., 60 MHz is applied from the high frequency power supply 34 to the upper electrode 3, e.g., at 1800 W and a bias voltage of, e.g., 2 MHz is applied from the high frequency power supply 41 to the lower electrode 4, e.g., at a range from 1800 to 2250 W with a timing of 1 second or less. Consequently, the first etching gas is converted into a plasma while, at the same time, the ion sheath regions are formed at a boundary between the plasma and the surfaces of the wafer W and the focus ring 5. As described above, the ion sheath region above the focus ring 5 has a different thickness according to the magnitude of a DC voltage applied to the electrode 51, whereby the plasma above the peripheral portion of the wafer W has a desired shape. Then, active species of the plasma move to the ion sheath region and are projected with a high perpendicularity toward the surface of the wafer W under a high frequency bias to etch the silicon nitride film 65.

When the first process, i.e., the etching process of the silicon nitride film 65, is terminated by doing so, process conditions are set by reading the process recipe for the second process to start the second process. First, the processing vessel 2 is opened to exhaust the first etching gas. And the applied voltage is converted by the actuator 52a such that a voltage of, e.g., 100V is applied to the electrode 51. Further, the high frequency voltages applied to the upper and lower electrodes 3 and 4 by the high frequency power supplies 36 and 41 are adjusted according to the process recipes. And when the second etching gas, e.g., Cl, is introduced into the processing vessel 2 from the second gas supplying system 34, the second etching gas is converted to a plasma. At this time, the second DC voltage applied to the electrode 51 controls the thickness of the ion sheath region above the focus ring 5 and a proper plasma suitable for etching the silicon film 64 is formed to etch the silicon film 64.

In accordance with the above-mentioned embodiment, since a shape of the ion sheath region at the boundary between the surface of the focus ring 5 and the plasma can be adjusted in each processing, e.g., according to kinds of films with different process conditions by applying the predetermined DC voltage to the electrode 51 of the focus ring 5, the shape of a plasma suitable for processing the surface of the wafer W uniformly can be formed. Accordingly, the focus ring 5 may be also used in a plurality of different processes, thus promoting sharing of the present apparatus. The sharing of the present apparatus is advantageous since it contributes to reduction of the footprint of an apparatus and costs incurred in manufacturing and operating apparatuses.

Additionally, in accordance with the aforementioned embodiment, for example, when a plurality of processing vessels 2 are used for the same process, the adjustment of matching plasma shapes of these apparatuses can be readily performed. For example, when a plurality of the aforementioned plasma processing apparatuses described above are installed in a clean room and the same process is executed in these apparatuses, subtle differences may exist in process results of the wafers W because assembly of the apparatuses or the like are different slightly. However, in such a case, by adjusting voltages applied to the electrode 51, the characteristics of the apparatuses, i.e., the results of the process, can be match to each other. Thus, it can be easily achieved to match the apparatuses. For example, it is preferable that states of the processed wafers W are checked and an applied voltage for each apparatus is adjusted finely depending on the result. Further, the present invention is not limited to promoting the sharing of an apparatus and may be an apparatus for exclusive use in a certain type of process, e.g., etching of a specific film.

The plasma processing apparatus of the present invention is not limited to a structure in which two kinds of processes, such as the first and second processes are performed. And, for example, when there are five deposition films on the surface of the wafer W, three, four, or five different processes may be shared according to the kinds of films with different process conditions. Further, six and more different processes may be performed. Even with this structure, a same effect as described above can be obtained.

In the plasma processing apparatus of the present invention, the focus ring 5 formed of an insulator is not necessarily disposed close to the periphery of the wafer W, and a conductor, for example, a silicon ring 8 may be installed through a circumference direction between the outer periphery of the wafer W and an inner periphery of the focus ring 5, as shown in FIG. 5. Even with this structure, a same effect as described above can be obtained.

In the plasma processing apparatus of the present invention, the number of the electrode 51 embedded in the focus ring 5 is not limited to one. And for example, two ring-shaped electrodes 51a and 51b are disposed in the focus ring 5 on a line along a diametrical direction and connected to DC power supplies 52A and 52B, respectively, each of which is provided with an actuator to control a DC voltage independently. Even with this structure, a same effect as described above can be obtained. Further, a DC voltage applied to the outer electrode 52b is lower than that applied to the inner electrode 51a. Since DC voltages can be set minutely within the surface of the focus ring 5, for example, it is possible to adjust the thickness of the ion sheath region with a higher precision. Furthermore, the processing vessel 2 is not symmetrical in a plan view due to, for example, a conveying opening formed on a portion thereof and the like. This may result in a radially nonuniform plasma or a poor in-surface uniformity along a specific diametrical direction from the center. In such a case, it is possible that a specific part of the electrode 51 in the focus ring 5 is separated from the other part of the electrode 51 along a circumference direction and voltages applied to both parts may be different from each other for guaranteeing the radial uniformity of the plasma.

In the present invention, it is not limited to the actuator 52a to convert the applied voltage, and for example, DC power supplies 52 for the first process and the second process are installed and a switch may be used to convert the applied voltage. Even with this structure, a same effect as described above can be obtained. Additionally, etching is employed as an example of the plasma process in the previous example, but the present invention can be applied to various plasma processes, for example, CVD and ashing.

Finally, an example of a system including the aforementioned plasma processing apparatus is described with reference to FIG. 7. A reference numeral 90 in the drawing refers to a first transferring and mounting chamber 90 connected to cassette chambers 92A and 92B via gate valves G1 and G2 at both sides thereof. The cassettes 91 capable of receiving a number of wafers W can be charged into the cassette chambers 92A and 92B. Further, preliminary vacuum chambers 93A and 93B are connected to the rear of the first transferring and mounting chamber 90 via gate valves G3 and G4, respectively. Furthermore, a first transferring and mounting unit 94 including, e.g., a multi-joint arm is disposed in the first transferring and mounting chamber 90. A second transferring and mounting chamber 95 is connected to the rear of the preliminary vacuum chambers 93A and 93B via gate valves G5 and G6, and processing vessels 2A, 2B and 2C (2) of the above-mentioned plasma processing apparatus are respectively connected to the right, the left and the rear side of the second transferring and mounting chamber 92 via gate valves G7 to G9 (corresponding to the gate valve 23). Still further, a second transferring and mounting unit 96 including, e.g., a multi-joint arm is disposed in the second transferring and mounting chamber 95.

In this system, the wafer W in the cassette 91 is conveyed from the first transferring and mounting chamber 90 to the preliminary vacuum chamber 93A, and from the preliminary vacuum chamber 93A to the second transferring and mounting chamber 95. For example, three kinds of films can be etched in the processing vessels 2A to 2C, respectively. The wafer W with the three kinds of films to be etched is loaded into an empty one 2A (2B, 2C) among the processing vessels 2A to 2C, and the three kinds of films are etched in the processing vessel 2A (2B, 2C). Then, the wafer W is unloaded from the processing vessel 2A (2B, 2C) and returned into the cassette 91 in an order opposite to the aforementioned loading process.

FIG. 8 is a vertical cross-sectional view of an example of a plasma etching processing apparatus, which is a plasma processing apparatus with a ring member of a plasma processing vessel, a subject of the present invention. A reference numeral 20 refers to a vacuum chamber included in the processing vessel, which is formed of a conductive material, such as aluminum, to have an airtight structure. And the vacuum chamber 20 is frame-grounded. Additionally, a cylindrical deposition shield 20a is disposed to an inner surface of the vacuum chamber 20 to prevent the inner surface from being damaged by plasma. Further, disposed in the vacuum chamber 20 are a gas shower head 30 serving also as an upper electrode and a mounting table 210 serving also as a lower electrode, which are installed to face each other. And connected to a lower surface is a gas exhaust pipe 26, which serves as a vacuum exhaust passageway communicating with a vacuum exhaust unit 25 having, e.g., a turbo molecular pump or a dry pump. Furthermore, an opening 27 for charging or discharging an object to be processed, e.g., a semiconductor wafer W, is formed on a sidewall portion of the vacuum chamber 20 and it can be opened or closed by a gate valve G. Permanent magnets 28 and 29, having, for example, a shape of ring, are mounted on an outside of a sidewall portion in such a manner that the opening 27 is located therebetween.

The gas shower head 30 has a plural number of holes 38 facing the object W to be processed on the mounting table 210, and is configured to supply a flow-controlled or pressure-controlled processing gas coming from an upper gas supply line 39 to a surface of the object W to be processed uniformly through the corresponding holes 38.

Disposed under the gas shower head 30 from about 5 mm to 150 mm apart therefrom, the mounting table 210 includes a cylindrical main body 211 which is formed of, for example, aluminum having its surface subjected to alumite treatment and is insulated by an insulating member 211a from the vacuum chamber 20; an electrostatic chuck 212 mounted on an upper surface of the main body 211; a circular focus ring 213 surrounding the electrostatic chuck 212; and an insulation ring 213a as a circular insulation member inserted between the focus ring 213 and the main body 211. The electrostatic chuck 212 includes a sheet-shaped chuck electrode 216 and an insulating layer 215 formed of, e.g., polyimide covering the surface of the chuck electrode 216. Further, depending on a process, an insulating or conductive material is selected for the focus ring 213 to confine or diffuse reactive ions as aforementioned. An electrode (not shown) having a shape of, e.g., ring is embedded in the focus ring 213, as in the embodiment of FIG. 1. In addition, there are installed the DC power supply 52, the actuator 52a, and the controller 6 as shown in FIG. 1, and first and the second DC voltage are applied to the electrode in the focus ring 213. Moreover, in the same way as described above, an electrode may be embedded in the insulation ring 213a and a voltage to be applied to the electrode may be converted by connecting the electrode to the above or another DC power supply.

In the mounting table 210, for example, the body 211 thereof is connected to a high frequency power supply 200 via a capacitor C1 and a coil L1, and a high frequency power in a range of, e.g., from 13.56 MHz to 100 MHz is applied thereto.

Moreover, installed inside the mounting table 210 are a temperature control unit 314a of a cooling jacket and a heat transfer gas supply unit 314b to supply, e.g., He gas to a rear surface of the object W to be processed. A process surface of the object W to be processed, held on the mounting table 210, can be maintained at a desired temperature by activating the temperature control unit 314a and the heat transfer gas supply unit 314b. The temperature control unit 314a has an inlet line 315 and a discharge line 316 for circulating a coolant via the cooling jacket. The coolant regulated to be kept at an adequate temperature is provided into the cooling jacket by the inlet line 315, and the coolant after heat exchange is exhausted to outside by the discharge line 316.

A ring-shaped exhaust plate 214 having a plurality of exhaust holes punched therein is disposed between the mounting table 210 and the vacuum chamber 20 and installed at a position lower than a surface of the mounting table 210 in such a manner that it surrounds the mounting table 210. The exhaust plate 214 serves to optimally confine the plasma between the mounting table 210 and the gas shower head 30 and to regulate flows of exhaust current are regulated. Additionally, protrudently installed in the mounting table 210 are a plural number, for example, three, of elevating pins 310 (only two pins are shown) as elevating members for executing transfer of the object W to be processed between an external transfer arm (not shown) and the mounting table 210 such that the elevating pins 310 can be elevated and lowered by a driving unit 312 through a coupling member 311. A reference numeral 313 refers to a bellows for keeping the space between through holes of the elevating pins 310 and the atmosphere airtight.

In the plasma etching processing apparatus, after being transferred into the vacuum chamber 20 via the gate valve G and the opening 27, the object W to be processed is first mounted on the electrostatic chuck 212, the gate valve G is closed, and an inside of the vacuum chamber 20 is exhausted through the gas exhaust pipe 26 by the vacuum exhaust unit 25 to a predetermined degree of vacuum. Thereafter, when the processing gas is supplied to the inside of the vacuum chamber 20, a DC voltage is simultaneously applied from a DC power supply 217 to a chuck electrode 216, so that the object W to be processed is electrostatically attracted to be held by the electrostatic chuck 212. Under the condition, the high frequency power with a predetermined frequency is applied from the high frequency power supply 200 to the main body 211 of the mounting table 210 to thereby generate a high frequency electric field between the gas shower head 30 and the mounting table 210, which in turn transforms the processing gas into plasma used for performing an etching process on the object W to be processed on the electrostatic chuck 212.

As the processing gas, a gas including a halogen element, for example, a fluoride such as $C_4F_8$ and $NF_3$, a chloride such as $BCl_3$ and $SnCl_4$, and a bromide such as HBr, is used. Since a highly strong corrosive environment is generated inside the vacuum chamber 20 owing to this, a strong plasma resistance is imperatively required for the members within the vacuum chamber 20, that is, the internal members of the plasma processing vessel, for example, the deposition shield 20a, the exhaust plate 214, the focus ring 213, the shower head 30, the mounting table 210, the electrostatic chuck 212, and the inner wall member of the vacuum chamber 20.

Hereinafter, the above-mentioned ring member will be described in detail. The ring member to which the structure of the present invention is applied corresponds to the focus ring 213 and insulation ring 213a. The insulation ring 213a lies under the focus ring 213, but it is preferable that a following process is executed also on the insulation ring 213a because an inner periphery thereof comes into contact with the processing gas or cleaning fluid. Further, in the present invention, the following process may be executed on only the focus ring 213.

In a conventional case where a base material having a thermally sprayed film is formed thereon is used as the ring member of a processing vessel, a thermally sprayed film is bound to be peeled off. The present inventors have found in their investigation that the peeling off of the thermally sprayed film on the ring member of the plasma processing vessel is resulted from the fact that the processing gas and/or the cleaning fluid infiltrate through air pores (fine holes) of the thermally sprayed film, a boundary portion between the thermally sprayed film and the base material or a portion damaged by plasma and gas to thereby reach the base material, which ultimately corrodes a surface of the base material.

In other words, if a ring member of a processing vessel, where a plasma treatment has been performed by using a processing gas including a fluoride, is prepared to analyze a boundary surface (a base material surface) between the base material and the thermally sprayed film, F (fluorine) can be found therein. From this, it is suggested that F reacts on water (OH) to form HF, whereby the base material surface is corrosively changed (a corrosion by-product is generated), which leads to the peeling off of the thermally sprayed film.

Therefore, it is important that the boundary surface between the base material and the thermally sprayed film, i.e., the base material surface, is not exposed to the processing gas or the cleaning fluid.

Based on the aforementioned facts, a portion having barrier function which is hardly corroded is formed at a position between the surface of the sprayed film and the base material in the ring member of FIG. 8, even if it is exposed to the processing gas or the cleaning fluid, thus being capable of preventing the processing gas or the cleaning fluid from reaching the surface of the base material.

By forming the portion having the barrier function by using a high corrosion-resistant material, the surface of the base material can be protected from the processing gas or the cleaning fluid infiltrating through the air pores (the fine holes) of the thermally sprayed film. Additionally, if the portion having the barrier function is in contact with the base material, employing a material with high adhesivity for the portion makes it possible to protect the surface of the base material from infiltration of the processing gas or the cleaning fluid through a boundary surface between the portion having the barrier function and the surface of the base material.

Hereinafter, a concrete structure of the ring member will be described in detail. First, as shown in FIG. 9, a first example of the ring member basically includes a base material 71 and a film 72 formed on its surface. The film 72 has a main layer 73 formed by thermal spraying and a barrier coat layer 74 formed between the base material 71 and the main layer, which has the barrier function to be rarely corroded even when exposed to the processing gas or the cleaning fluid.

Various types of steel including stainless steel (SUS), Al, Al alloy, W, W alloy, Ti, Ti alloy, Mo, Mo alloy, carbon, oxide or non-oxide based sintered ceramic body, carbonaceous material and the like are used properly for the base material 71 as an object on which the film 72 is constructed.

It is preferable that the barrier coat layer 74 is formed of ceramic including at least one kind of element selected from the group consisting of B, Mg, Al, Si, Ca, Cr, Y, Zr, Ta, Ce and Nd, and, more particularly, at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. For example, products of TOCALO co., LTD. such as "CDC-ZAC" and "super ZAC" are applicable. "CDC-ZAC" is a complex ceramic including $Cr_2O_3$ as a main ingredient, and has features such as imporosity, high hardness, high adhesion and the like.

On the other hand, "super ZAC" is a complex ceramic including $SiO_2$ and $Cr_2O_3$ as main ingredients, and has excellent heat-resistance and abrasion-resistance in addition to imporosity, high hardness and high adhesion. It is preferable to form the barrier coat layer 74 by a thermal spraying method. The thermal spraying method is a method for spraying raw material melted by a heat source such as combustion gas and electricity on a basic material to form a film. Further, the barrier layer 74 may be formed by employing a technique for forming a thin-film such as PVD and CVD method, an immersion method, a coating method, or the like. The PVD method is a method of coating various ceramic films coated at low temperature by employing an ion plating method, while the CVD method is a method for coating single layer or multiple layers at high temperature by a thermal chemical vapor deposition. Furthermore, the method is a method for performing a heat treatment after immersing various materials being immersed into a resin solution, and the coating method is a method for performing the heat treatment at a predetermined temperature after various materials being coated with a resin solution. It is desirable that the barrier coat layer 74 is of a thickness ranging from 50 to 100 μm.

In this case, it is preferable to perform sealing by using a resin on at least one portion of the barrier coat layer 74, e.g., on a surface contacted with the base material 71, or on the whole of the barrier coat layer 74. It is desirable that the resin is selected from the group consisting of SI, PTFE, PI, PAI, PEI, PBI and PFA. That is, the barrier coat layer 74 made of ceramic has porosity with air pores (fine holes) when forming by using the aforementioned thermal spraying method, but sealing the fine holes in at least a portion of the porous layer with the resin can prevent the gas or the cleaning fluid from infiltrating through the fine holes of the main layer 73 made of the thermally sprayed film, thus protecting the base material 71 effectively.

Additionally, SI refers to silicon, PTFE to polytetrafluoroethylene, PI to polyimide, PAI to polyamideimide, PEI to polyetherimide, PBI to polybenzimidazole, and PFA to perfluoroalkoxyalkane.

The sealing treatment may be executed by employing a sol-gel method. The sealing treatment employing the sol-gel method is performed by sealing with a sol (a colloidal solution) in which ceramic is dispersed in an organic solvent, and then by the gelation by heating. Accordingly, the sealing by using ceramic is substantialized, so that a barrier effect can be improved. It is preferable that a material selected from the elements of the Group 3a in the periodic table is used in the sealing treatment of this case. Among them, highly corrosion-resistant $Y_2O_3$ is desirable.

Moreover, engineering plastics may be used as another alternative material for the barrier coat layer 74. Specifically, a resin selected from the group consisting of PTFE, PI, PAI, PEI, PBI, PFA, PPS and POM is preferable and, for example, "Teflon®" (PTFE), a product of DUPONT INC., and the like are applicable. These resins have excellent adhesivity and chemical resistance which are sufficient enough to stand against the cleaning fluid in cleaning.

Further, PTFE refers to polytetrafluoroethylene, PI to polyimide, PAI to polyamideimide, PEI to polyetherimide, PBI to polybenzimidazole, PFA to perfluoroalkoxyalkane, PPS to polyphenylenesulfide, and POM to polyacetal.

Furthermore, an anodic oxidized film 75 may be formed between the base material 71 and the barrier coat layer 74 as depicted in FIG. 10. In this case, it is desirable that the anodic oxidized film is formed by organic acid, such as oxalic acid, chromic acid, phosphoric acid, acetic acid, formic acid or sulfonic acid, which will result in an oxidized film whose corrosion resistance is much better than those produced by an anodic oxidation treatment by sulfuric acid, so that it can further suppress the corrosion by the processing gas and the cleaning fluid. It is preferable that the anodic oxidized film 75 is of a thickness ranging from 10 to 200 μm.

As described above, in case the anodic oxidized film 75 is formed between the base material 71 and the barrier coat layer 74, sealing fine holes of the anodic oxidized film 75 can markedly improve corrosion resistance. In this case, a metal salt sealing is applicable, in which a material is immersed in hot water including metal salt such as Ni, so that, in fine holes of the oxidized film, an aqueous solution of metal salt is hydrolyzed, whereby hydroxide is precipitated, thus performing sealing.

Further, the same effect can also be achieved even when the sealing treatment of the fine holes of the anodic oxidized film 75 is executed by using the resin. It is desirable that the resin is selected from the group consisting of SI, PTFE, PI, PAI, PEI, PBI and PFA as described above.

Furthermore, an anodic oxidized film (KEPLA-COAT®) with a porous ceramic layer may be used as the anodic oxidized film 75 formed on the surface of the base material 71.

Further, the anodic oxidized film (KEPLA-COAT) is formed by immersing the base material as an anode in an alkali-based organic electrolyte to discharge an oxygen plasma therein.

It is preferable that the main layer 73 as the thermally sprayed film includes at least one kind of element selected from the group consisting of B, Mg, Al, Si, Ca, Cr, Y, Zr, Ta, Ce and Nd, and, to be more specific, it is preferable to include at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. In this case, it is desirable that the main layer 73 is of a thickness ranging from 10 to 500 μm.

When the ring member with these structures are fabricated, it is preferable to increase adhesivity of the barrier coat layer 74 or the anodic oxidized film 75 to be formed on the surface of the base material 71 by executing a blast treatment for blowing up particles such as $Al_2O_3$, SiC or sand on the surface of the base material 71 to make the surface thereof microscopically uneven. Additionally, etching the surface, e.g., by immersion in a given medicinal fluid, is allowed as a method for making the surface uneven, not limiting the method to the aforementioned blast treatment.

Next, the aforementioned barrier coat layer 74 is formed directly on the base material 71 or through the anodic oxidized film 75 by employing the thermal spraying method or another proper method. If necessary, the sealing treatment as described above is executed.

When the sealing treatment is performed, the aforementioned resin or sol of ceramic is coated on the surface of the barrier coat layer 74, or the base material 71 with the barrier coat layer 74 thereon is immersed in a resin sealing material or the sol of ceramic. In case the sealing is performed by the sol of ceramic, gelation by heating is followed by heating.

After forming the barrier coat layer 74, the main layer 73, a thermally sprayed film, is sequentially formed, wherein the layer is formed of at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. In addition to selecting a material with excellent adhesivity as the barrier coat layer 74, the blast process and the like may be performed on the surface of the barrier coat layer 74 to further improve adhesivity with the main layer 73.

As described above, in this example, the problem that the thermally sprayed film 72 on the base material 71 is peeled off by generation of the corrosion by-product on the surface of the base material 71 can be solved by forming the barrier coat layer 74 made of material with excellent corrosion resistance against the processing gas including the halogen element or the cleaning fluid between the main layer 73 as the thermally sprayed film and the base material 71 in such a way that the surface of the base material 71 is not exposed to the processing gas (halogen element) or the cleaning fluid.

Hereinafter, a second example of the ring member will be described. In the second example, as shown in FIGS. 11A, 11B and 11C, a film 76 is formed on the surface of the base material 71 by thermal spraying of ceramic and a sealing-treated portion 76a is formed in at least a portion of the film 76. The sealing-treated portion 76a is formed in a side of a portion of the film 76 making a contact with the base material 71 in an example of FIG. 11A, in a surface side of the film 76 in the example of FIG. 11B, and in the whole of the film 76 in the example of FIG. 11C, respectively.

It is preferable that the film 76 includes at least one kind of element selected from the group consisting of B, Mg, Al, Si, Ca, Cr, Y, Zr, Ta, Ce and Nd, and, to be more specific, at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. In this case, it is desirable that the film 76 is of a thickness ranging from 50 to 300 μm. Further, the same material as in the first example can be used as the base material 71.

The sealing-treated portion 76a can be formed by sealing by employing an exactly same resin sealing or sol-gel method as executed on the barrier coat layer 74 in the first example. As described above, by forming the sealing-treated portion 76a, the gas or the cleaning fluid infiltrating through the fine holes of the film 76, i.e., the thermally sprayed film, can be effectively blocked, so that the base material 71 can be protected sufficiently. Because the sealing-treated portion 76a is for preventing the gas or the cleaning fluid from reaching the base material 71, any one of those shown in FIGS. 11A to 11C can be effective. However, forming the sealing-treated portion 76a on the side of a portion of the film 76 making a contact with the base material 71 as shown in FIG. 11A is more preferable. That is, if the ring member of the processing vessel whose thermally sprayed film has undergone the sealing treatment is used in a plasma atmosphere obtained by applying high frequency power in a high vacuum area (e.g., 13.3 Pa), a diluted organic solvent (e.g., ethyl acetate) in a sealing material may be evaporated, or the sealing material may be corroded by the plasma, the processing gas and the like, so that air pores (fine holes) may be formed in the thermally sprayed film again. Due to these air pores, surface state (e.g., temperature and adhesion state of a by-product) of the ring member of the processing vessel is changed with time, so that it is possible to exert baleful influence on the process in the processing vessel. Thus, as shown in FIG. 11A, by avoiding to perform the sealing treatment on the surface side portion of the film 76, surface degradation of the film 76 may be suppressed and the process can be executed stably. Additionally, the sealing-treated portion 76a may be formed, for example, in the middle of the film 76, without limiting the positions to those depicted in FIGS. 11A to 11C. It is desirable that the sealing-treated portion 76a is from 50 to 100 μm thick.

Also in this example, as shown in FIG. 12, exactly the same anodic oxidized film 75 as in the first example can be formed between the base material 71 and the film 76. Further, in this case, sealing the anodic oxidized film 75 is preferable and the same metal salt sealing as mentioned above is available for this sealing treatment.

Hereinafter, a third example of the ring member will be described. In the third example, as shown in FIGS. 13A and 13B, a film 77 is formed on the surface of the base material 71 by the thermal spraying of ceramic, the film 77 has a two-layer structure including a first ceramic layer 78 and a second ceramic layer 79, and a sealing portion is formed in at least a portion of at least one of them. In the example of FIG. 13A, a sealing-treated portion 78a is formed in the first ceramic layer 78 located at a surface side, and in the example of FIG. 13B, a sealing-treated portion 79a is in the second ceramic layer 79 located at a base material 71 side.

Both the first ceramic layer 78 and the second ceramic layer 79, being included in the film 77, include at least one kind of element selected from the group consisting of B, Mg, Al, Si, Ca, Cr, Y, Zr, Ta, Ce and Nd, and, to be more specific, include at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$ is preferable. In this case, it is desirable that the film 77 is from 50 to 300 μm thick. Further, exactly the same material as in the first example can be used as the base material 71.

The sealing-treated portions 78a and 79a may be formed by employing exactly the same resin sealing or sol-gel method as executed on the barrier coat layer 74 of the first example. As described above, by installing the sealing-treated portions 78a and 79a, the gas or the cleaning fluid infiltrating through the fine holes of the first and second ceramic layers 78 and 79, i.e., the thermally sprayed films, can be effectively blocked, so that the base material 71 can be protected sufficiently. Because the sealing-treated portions 78a and 79a are used for preventing the gas or the cleaning fluid from reaching the base material 71 as described above, positions of the sealing-treated portions 78a and 79a are not limited as long as their functions can be realized effectively, and the whole layer may also be used as the sealing-treated portion. Further, the sealing-treated portion may be formed in both sides of the first and second ceramic layers 78 and 79. It is desirable that the sealing-treated portions 78a and 79a are from 50 to 100 μm thick.

As described above, since, by allowing the film 77 formed on the base material 71 to have the two-layer structure, materials of these two layers can be appropriately selected in accordance with the required corrosion resistance and barrier property, it can be widely applied with a very high degree of freedom by performing the sealing treatment at a desired position. For example, the corrosion-resistance and the barrier property can be much enhanced if $Y_2O_3$ is used as the first ceramic layer 78 located toward the surface, $YF_3$ or $Al_2O_3$ is used as the second ceramic layer 79 located toward the base material 71 and the sealing is executed in at least a portion of the second ceramic layer 79.

As shown in FIG. 14, in this example, exactly the same anodic oxidized film 75 as in the first example may be formed between the base material 71 and the film 77. Further, in this case, sealing the anodic oxidized film 75 is preferable, wherein the same metal salt sealing and the like as mentioned above and the like are available.

In order to confirm the effect of the above structure of the ring member, following samples were prepared; a first sample was made by forming a thermally sprayed film of $Y_2O_3$ on a base material of Al alloy, a second sample was made by forming a thermally sprayed film of $Y_2O_3$ through a resin (PTFE) barrier coat layer on a base material of Al alloy; and a third sample was made by forming a thermally sprayed film of $Y_2O_3$ on a base material of Al alloy and sealing some of the thermally sprayed film with the resin. Then, the surface states of the thermally sprayed films were subject under plasma environment after dropping a HF solution on the surfaces of the first to the third samples to compare with each other. To be more specific, the samples were put under a plasma atmosphere of a CF-based gas for three minutes after dropping a 38% HF solution of 10 μl on each surface of the samples and being heated at 50° C. for three hours. As a result, it was found that a crack had developed on the whole surface of the first sample on which a countermeasure for peeling off of the thermally sprayed film had not been executed, while no crack had developed and the surfaces of the base materials were protected by preventing the infiltration of hydrofluoric fluid in the second sample where the barrier coat layer was formed between the base material and the thermally sprayed film and the third sample where some of the thermally sprayed film was sealed by the resin.

In a case where $Al_2O_3$ and $Y_2O_3$ are used as the ring member, various problems occur since a large amount of water is absorbed due to high reactivity on water in the air when the vacuum chamber, i.e., the processing vessel, is open to atmosphere or undergoes the wet cleaning. However, the present inventors have found in their investigation that these problems can be solved by performing hydration treatment on ceramic, such as $Y_2O_3$, including an element of the Group 3a in the Periodic table or forming a hydroxide including these elements.

Based on the above description, in the ring member (in this example, the focus ring 213 and the insulation ring 213a) in FIG. 8, a hydrated portion is formed of ceramic including the element of the Group 3a in the periodic table, or at least a portion of that is formed of hydroxide including that element.

In the ring member of the plasma processing vessel made in this way, release of water hardly occurs during the plasma process since the structure makes it difficult to adsorb water and release water therefrom.

First, in a fourth example of the ring member, as shown in FIG. 15, a film 82 made of ceramic including an element of the Group 3a in the periodic table is formed on a base material 81 and a hydration-treated portion 82a is formed, for example, at least in a surface portion of the film 82.

Various types of steel including stainless steel (SUS), Al, Al alloy, W, W alloy, Ti, Ti alloy, Mo, Mo alloy, carbon, oxide and non-oxide based sintered ceramic body, carbonaceous material and the like are used properly for the base material 81 in a similar manner to the base material 71.

The film 82 may be made of ceramic including an element of the Group 3a in the periodic table, but it is preferable to be made of oxide including the element of the Group 3a in the Periodic table. Further, among these, $Y_2O_3$, $CeO_2$, $Ce_2O_3$ and $Nd_2O_3$ are preferable and, among them, $Y_2O_3$ is particularly desirable since it has been conventionally and widely used and has high corrosion resistance.

The film 82 can be formed preferably by employing a technique for forming a thin-film such as the thermally sprayed method and the PVD and CVD method. Further, it is possible to form the film by employing the immersion method, the coating method or the like.

The hydration-treated portion 82a can be formed, for example, by making the film 82 react on water vapor or high temperature hot water to cause a hydration reaction. In case of using $Y_2O_3$ as the ceramic, the reaction such as an equation (1) below occurs:

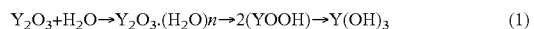

$$Y_2O_3 + H_2O \rightarrow Y_2O_3.(H_2O)n \rightarrow 2(YOOH) \rightarrow Y(OH)_3 \qquad (1)$$

wherein mantissa is not considered in Eq. (1).

As represented in the equation (1), by the hydration treatment, Y hydroxide is formed in the end. In case of another element of the Group 3a in the periodic table, such hydroxide is formed by almost the same reaction. $Y(OH)_3$, $Ce(OH)_3$ and $Nd(OH)_3$ are preferable for such hydroxide.

In order to confirm this, samples having the thermally sprayed film of $Y_2O_3$ on the base material were prepared, and X-ray diffraction measurement was performed on the one sample which was hydrated by immersion in high temperature hot water maintained at a temperature of 80° C. for 150 hours and then dehydrated at room temperature, and on another sample on which these treatments were not performed. The comparison result showed that $Y(OH)_3$ was detected only in the sample on which the hydration treatment was performed, confirming that hydroxide was formed by the hydration treatment, as shown in FIGS. 16A and 16B.

The hydroxide of the element of the Group 3a in the periodic table is highly stable and has features that chemically adsorbed water is difficult to be separated and it is difficult to adsorb water. The problem caused by water during the process can be avoided by forming the hydroxide like this by the hydration treatment.

In order to confirm an effect of the hydration treatment, after preparing samples which had a 200 μm thick film of thermally sprayed $Y_2O_3$ on the base material, one sample was treated by boiling water for three hours, while another sample was not treated by boiling water. IPA was sprayed on both of them. IPA spraying becomes an acceleration test since IPA has higher adsorption than water. The test showed that IPA was adsorbed to the non-hydrated sample but no adsorption occurred to the hydrated sample, as shown in FIG. 17. From this, it was confirmed that the hydration treatment made it difficult for adsorption to occur.

Next, in the same way, after preparing samples which had a 200 μm thick film of thermally sprayed $Y_2O_3$ on the base material, a sample was treated by boiling water for three hours while another sample was not treated by boiling water. Both of them were coated by the resin and cut to check cross sections thereof. The result, depicted in FIGS. 18A and 18B, showed that there were no differences on the surface states of the both samples. However, for the sample without the treatment, the film was transparent on the whole, confirming that the resin penetrated through the whole film. On the other hand, for the treated sample, only small portion close to the surface was transparent and the inside was white in the treated sample, indicating that the resin was hardly penetrated to the inside of the treated sample. That verifies that the hydration treatment causes hydrophobic property. Further, as shown in FIG. 18C, when the film about 20 μm thick from the surface was removed after the hydration treatment, it was found that the removed portion was transparent and hydrophobic property was reduced.

Moreover, an effect of $H_2O$ on a $Y_2O_3$ surface has been described in detail in a paper entitled "Specific Adsorption Behavior of Water on a $Y_2O_3$ Surface" of Kuroda et al. disclosed on pages 6937 to 6947 of Langmuir, Vol. 16, No. 17, 2000.

Hereinafter, the hydration treatment will be described in detail. The hydration treatment can be executed by heat treatment in an environment containing abundant water vapor or treatment in boiling water. Several water molecules can be attracted toward neighborhood of, e.g., an yttrium oxide ($Y_2O_3$) molecule to be combined together into one stable molecule cluster. At this time, main parameters include partial pressure of water vapor, temperature and time of heat treatment and the like. For example, a stable hydroxide can be formed by heat treatment for about 24 hours in a furnace with temperature ranging from about 100 to about 300□ under relative humidity which is equal to or greater than 90%. If relative humidity and temperature of heat treatment are low, it is preferable to prolong the time of treatment. Treatment at high temperature and high pressure is desirable for efficient hydration treatment. Because the hydration reaction on the surface of yttrium oxide can proceed basically even at room temperature if executed for a long time, the same final state can be obtained also under other conditions besides the above condition. Further, in the hydration treatment, using water including ion (alkali water with a pH higher than 7) results in a hydroxide with a better hydrophobic property than for the case using pure water.

Furthermore, not limited to the hydration treatment, other methods, for example, forming hydroxide at a raw material step, may be employed as long as the hydroxide is formed finally. In case of making the film by the thermal spraying method, because the raw material is exposed to high temperature, there is a concern that the hydroxide may be changed into an oxide if hydroxide is formed at the raw material step, but, even in this case, a hydroxide film can be formed by thermally spraying under a condition of high humidity. Instead of forming the hydration-treated portion like this, the hydroxide may be formed directly by using a different method.

The hydration-treated portion or hydroxide layer should be formed in a surface portion of the film 82 in order that the film 82 has a structure difficult to adsorb water and be separated from water. It is desirable that the hydration-treated portion or hydroxide film of this case is equal to or greater than 100 μm thick and the thickness thereof is set optimally depending on usage place.

Densification is also promoted by the hydration treatment for the ceramic including the element of the Group 3a in the Periodic table. For example, the $Y_2O_3$ film formed by the thermal spraying is porous before the hydration treatment as shown FIG. 19A, but it is densified by the hydration treatment as shown in FIG. 19B. By becoming dense like this, the same barrier effect as in the first embodiment is obtained in addition to the above effect.

In view of obtaining only the barrier effect, the hydration-treated portion 82a of the hydroxide formed by the hydration treatment need not be located necessarily in the surface portion of the film 82, and it may be formed at any position of the film 82. In a case of forming the hydroxide layer of the hydroxide formed by another method, it is desirable to perform the sealing by the resin or sol-gel method as mentioned above. In this example, in a similar way to the aforementioned embodiment, as depicted in FIG. 20, exactly the same anodic oxidized film 83 may be formed between the base material 81 and the film 82. Further, it is preferable to perform the sealing treatment on the anodic oxidized film 83, and, as this sealing treatment, the metal salt sealing identical to the aforementioned one is available.

Hereinafter, a fifth example of the ring member will be described. In the fifth example, as shown in FIGS. 21A and 21B, a film 84 is formed in the surface of the base material 81, it has two-layer structure including a first ceramic layer 85 and a second ceramic layer 86, and a hydration-treated portion is formed in at least a portion of at least one of the first and the second ceramic layer. A hydration-treated portion 85a is formed in a surface side of the first ceramic layer 85 in the example of FIG. 21A, and a hydration-treated portion 86a is formed in a side of the second ceramic layer 86 making a compact with the base material 81 in the example of FIG. 21B.

Hereinafter, a fifth example of the ring member is described. In the fifth example, as shown in FIGS. 21A and 21B, a film 84 is formed on the surface of the base material 81, and it has double layers including a first ceramic layer 85 and a second ceramic layer 86, and a hydration treatment portion formed in at least a portion of at least one of the first and second ceramic layers. A hydration treatment portion 85a is formed at the first ceramic layer 85 on the top (the surface) of the film 84 in the example of FIG. 21A, and a hydration-treated portion 86a is formed at the second ceramic layer 86 on the bottom of the film 84 in contact with the base material 81 in the example of FIG. 21B.

Both the first ceramic layer 85 and the second ceramic layer 86 included in the film 84 are formed of ceramic including an element of the Group 3a in the periodic table and, an oxide including an element of the Group 3a in the periodic table is preferable. Among them, $Y_2O_3$, $CeO_2$, $Ce_2O_3$ and $Nd_2O_3$ are preferable, and particularly, $Y_2O_3$ is preferable. Furthermore, exactly the same material as in the fourth example can be used as the base material 81.

These first and second ceramic layers 85 and 86 can be formed preferably, in a similar way as the film 82 in the first example, by employing the technique for forming a thin-film such as the thermal spraying method, the PVD method or the CVD method. Further, it is possible to form them by employing an immersion method, a coating method, or the like.

The hydration-treated portions 85a and 86a can be formed in exactly the same way as the hydration-treated portion 82a in the fourth example. If the hydration-treated portion is disposed in the surface portion of the film 84 as shown in FIG. 21A, a structure making adsorbing water or being separated from water difficult can be formed, and, if the hydration-treated portion is in the film 84, as shown in FIG. 21B, the barrier effect can be made work effectively. In order to form the hydration-treated portion in the film 84, after fabricating the second ceramic layer 86 on the base material 81, the hydration treatment is performed and the first ceramic layer 85 is formed. It is desirable that the hydration-treated portions 85a and 86a are of thickness equal to or greater than 100 μm.

By forming the film 84 on the base material 81 in the two-layer structure like this, it can widen the scope of its applicability with large degree of freedom, since materials of the two layers and position of the hydration treatment can be selected to better accommodate various specific requirements of the situation.

In this example, the same anodic oxidized film 83 as in the first example may be formed between the base material 81 and the film 84, as shown in FIG. 22.

Hereinafter, a sixth example of the ring member will be described. In the sixth example, as shown in FIG. 23, a film 87 is formed on the surface of the base material 81, and it has a first ceramic layer 88 formed of ceramic including at least one kind of element of the Group 3a in the periodic table; and a second ceramic layer 89 formed by thermal spraying of ceramic, wherein a hydration-treated portion 88a formed in a surface portion of the first ceramic layer 88.

As the ceramic of the first ceramic layer 88 including the element of the Group 3a in the periodic table, the oxide including the element of the Group 3a in the periodic table is preferable. Among them, $Y_2O_3$, $CeO_2$, $Ce_2O_3$ and $Nd_2O_3$ are preferable and $Y_2O_3$ is particularly preferable. It is desirable that the first ceramic layer 88 is of thickness ranging from 100 to 300 μm. The first ceramic layer 88 can be formed preferably, in a similar way to the film 82 in the fourth example, by employing the technique for forming a thin-film such as the thermally spraying method, the PVD method and the CVD method. Further, it is possible to form the layer by employing the immersion method, the coating method, or the like.

It is preferable that the second ceramic layer 89 includes at least one kind of element selected from the group consisting of B, Mg, Al, Si, Ca, Cr, Y, Zr, Ta, Ce and Nd, and, to be more specific, at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$. It is desirable that the second ceramic layer 89 is of thickness ranging from 50 to 300 μm. Further, exactly the same material as in the fourth example can be used as the base material 81.

The hydration-treated portion 88a can be formed in the same way as the hydration-treated portion 82a in the fourth example. Because the hydration-treated portion is formed in the surface portion of the film 87, the film 87 can be made to have a structure difficult to adsorb water and release water. In addition, the barrier effect may be made work effectively by forming the hydration-treated portion 88a inside the first ceramic layer 88. It is desirable that the hydration-treated portion 88a is of thickness equal to or greater than 100 μm.

As shown in FIG. 24, it is preferable to form a sealing-treated portion 89a in the second ceramic layer 89. The sealing-treated portion 89a can be formed by using the same resin sealing or sol-gel method as described in the above-mentioned first to third embodiments. The base material 81 can be protected sufficiently by installing the sealing-treated portions 89a since the gas or the cleaning fluid infiltrating through fine holes of the second ceramic layer 89, i.e., the thermally sprayed film, can be blocked effectively. Further, the sealing-treated portion 89a can be formed at any position of the second ceramic layer 89.

By forming the structures as shown in FIGS. 23 and 24, the film 87 can have a structure difficult to adsorb water and release water by the hydration-treated portion 88a of the first ceramic layer 88, simultaneously having excellent corrosion-resistance. Besides, the base material 81 can be protected effectively by the barrier effect of the second ceramic layer 89. Particularly, in the structure shown in FIG. 24, the existence of the sealing-treated portion 89a can further enhance the barrier effect.

Moreover, as shown in FIG. 25, the first ceramic layer 88 and the second ceramic layer 89 may be installed in a reversed order. In this case, protection effect on the base material 81 may be improved since the hydration-treated portion 88a of the first ceramic layer 88 laid out next to the base material 81 can enhance the barrier effect effectually.

In this example, as shown in FIG. 26, the same anodic oxidized film 83 as in the first example may be formed between the base material 81 and the film 87.

Hereinafter, a seventh example of the ring member will be described. In the ring member in the seventh example, as shown in FIG. 27, a hydration-treated portion 98 is formed in a surface portion of a sintered ceramic body 97 including the element of the Group 3a in the periodic table. The hydration-treated portion 98 can be formed in the same manner as in the above-mentioned embodiment, and the hydration treatment generates the hydroxide including the element of the Group 3a in the periodic table.

The hydration-treated portion 98 is formed in the surface portion, so that a structure making it difficult to adsorb water or release water is formed. It is desirable that the hydration-treated portion 98 or the hydroxide film of this case is of thickness equal to or greater than 100 μm.

In the seventh embodiment, as in the fourth to the sixth embodiments, ceramic including an element of the Group 3a in the periodic table is preferably oxide including an element of the Group 3a in the periodic table. Among them, $Y_2O_3$, $CeO_2$, $Ce_2O_3$ and $Nd_2O_3$ are preferable and, in particular, $Y_2O_3$ is desirable.

Additionally, in the above embodiments, the case of applying the present invention to the ring members (the focus ring 213 and insulation ring 213a) of a parallel plate plasma etching apparatus of a magnetron type using a permanent magnet has been described as an example, but the present invention is not limited to the apparatus of this structure, and can be applied to the plasma processing vessel used in a parallel plate plasma etching apparatus having no magnetron; another plasma etching processing apparatus and etching apparatus such as an inductively coupled one; and an apparatus executing various plasma processes such as an ashing and a film forming process in addition to etching.

While the invention has been shown and described with respect to the preferred embodiments, it will be understood by those skilled in the art that various changes and modifications may be without departing from the spirit and scope of the invention as defined in the following claims.

INDUSTRIAL APPLICABILITY

A plasma processing apparatus in accordance with the present invention is applicable to an apparatus executing plasma processes such as etching, e.g., on a semiconductor wafer and the like, because plasma states can be adjusted by applying a specified voltage to an electrode in a ring member. Further, the ring member of the present invention is desirable for a plasma process in a highly corrosive atmosphere, in particular, since a film formed on a base material is formed of ceramic with a high corrosion-resistance and a portion which functions as a barrier is installed. Furthermore, it is preferable as the ring member subjected to water problems, because its structure is stable in water by executing a hydration treatment on the ceramic including an element of the Group 3A of the periodic table.

Figure 1:
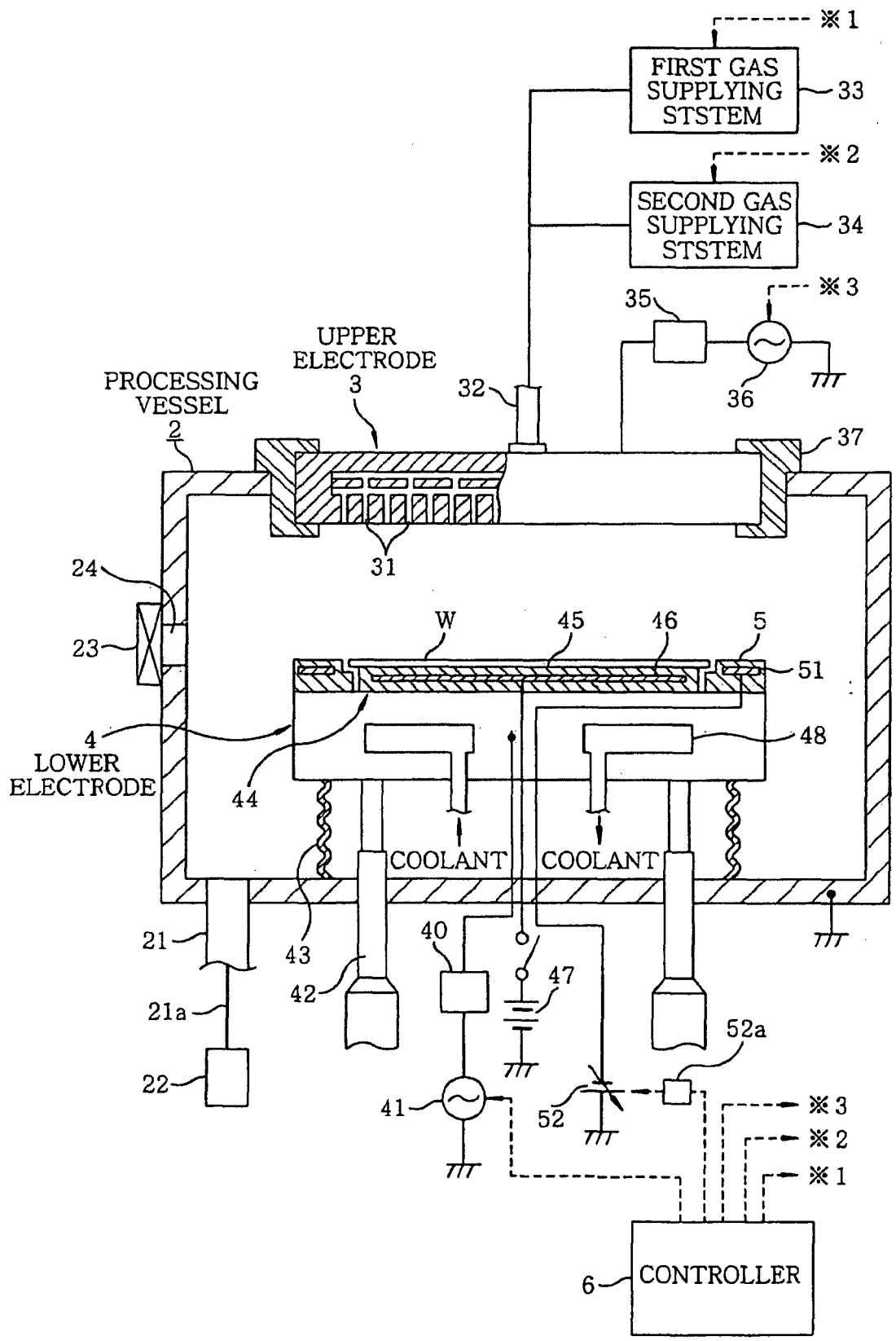
FIG. 1 shows a vertical cross-sectional view of a plasma processing apparatus in accordance with an embodiment of the present invention.
Figure 2:
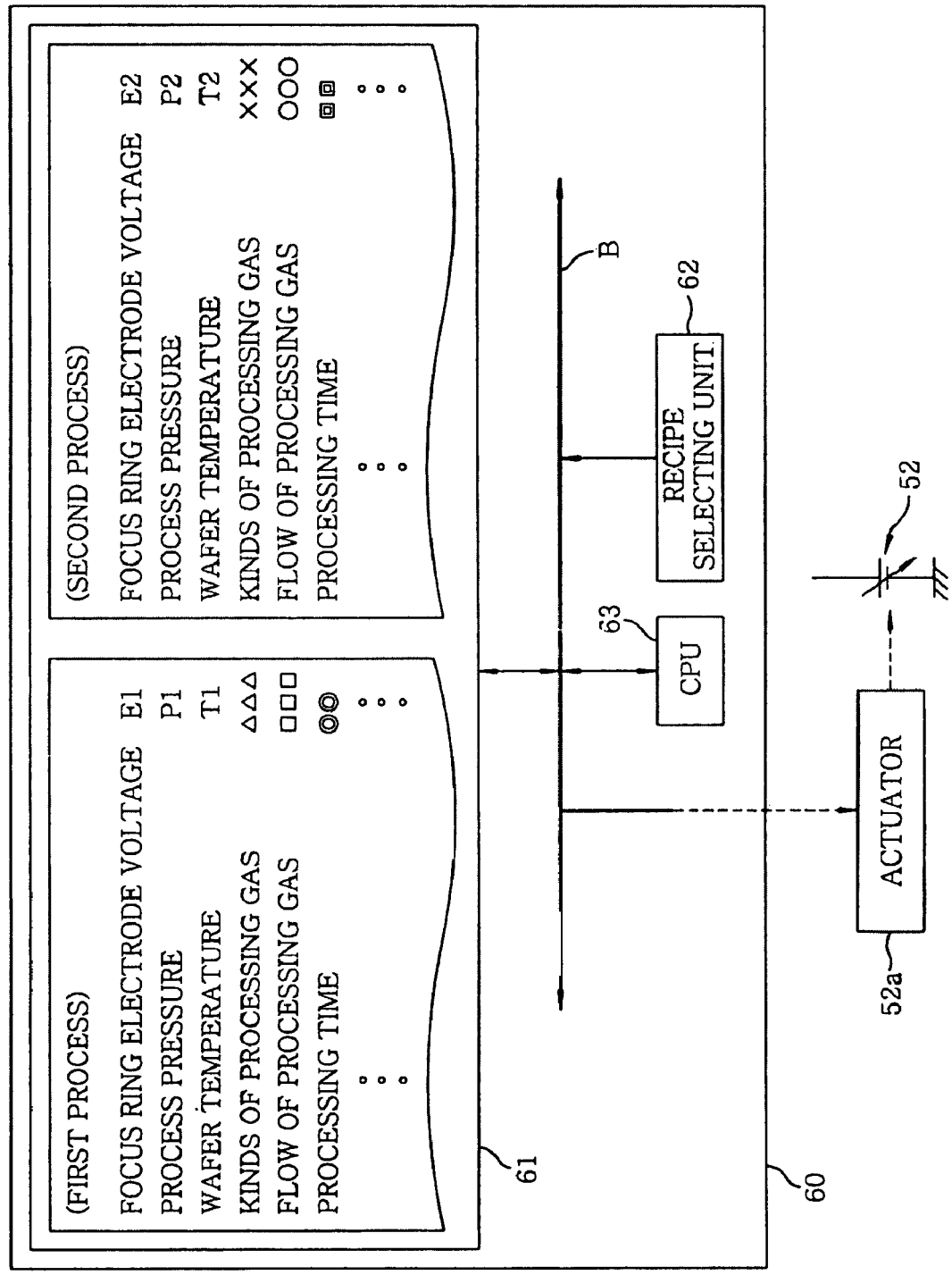
FIG. 2 illustrates an explanatory diagram of a controller of the plasma processing apparatus.
Figure 3A:
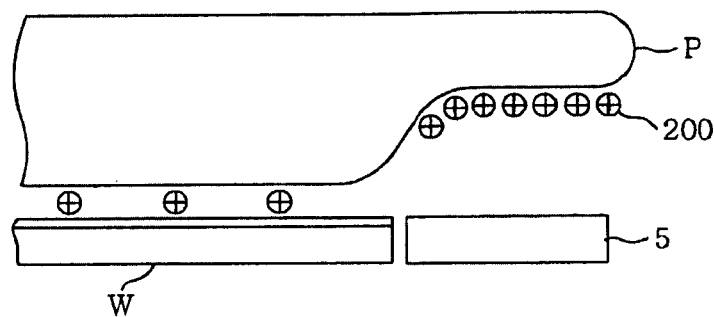
FIGS. 3A to 3D describe explanatory diagrams of plasma states in a plasma process using the plasma processing apparatus.
Figure 3B:
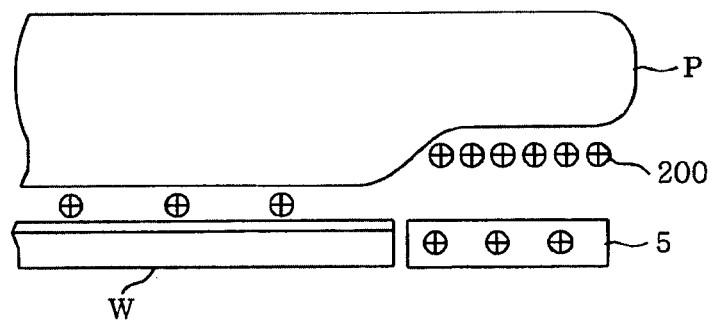
Figure 3C:
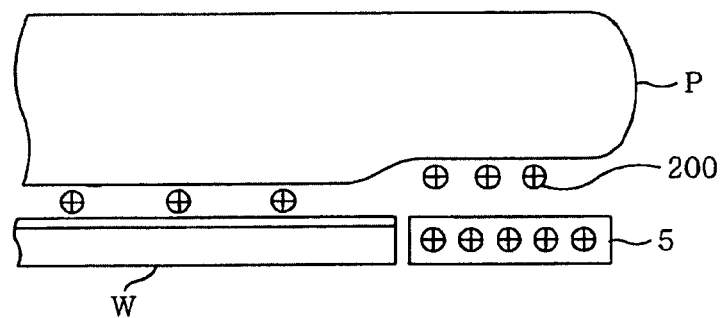
Figure 3D:
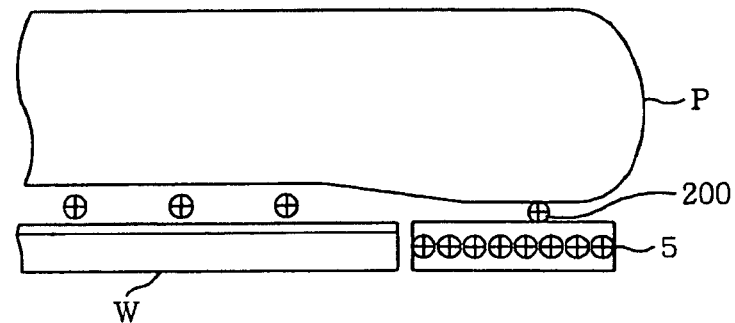
Figure 4A:
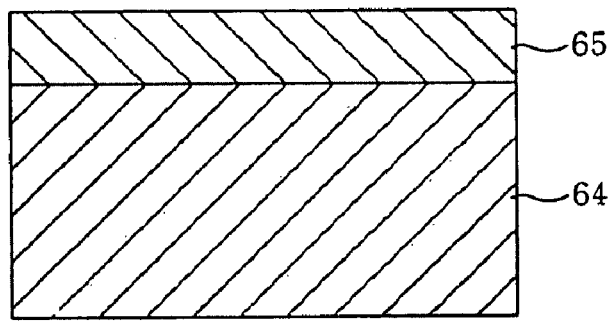
FIGS. 4A to 4C offer explanatory diagrams of multi-layers etched by using the plasma processing apparatus.
Figure 4B:
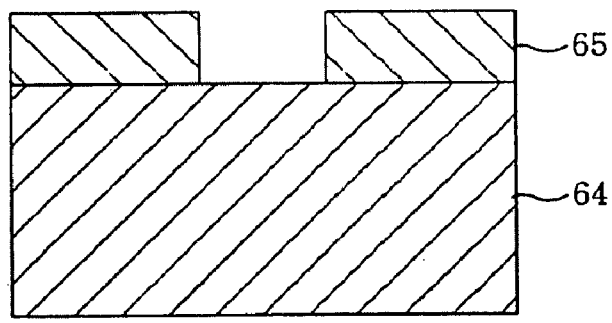
Figure 4C:
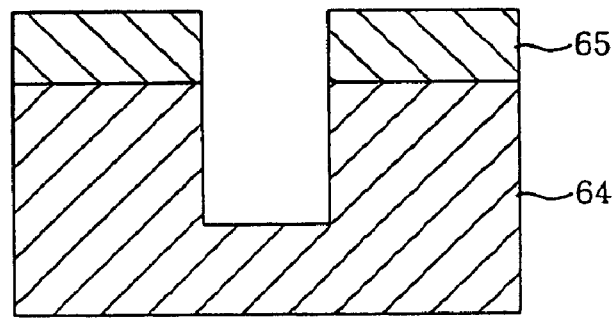
Figure 5:
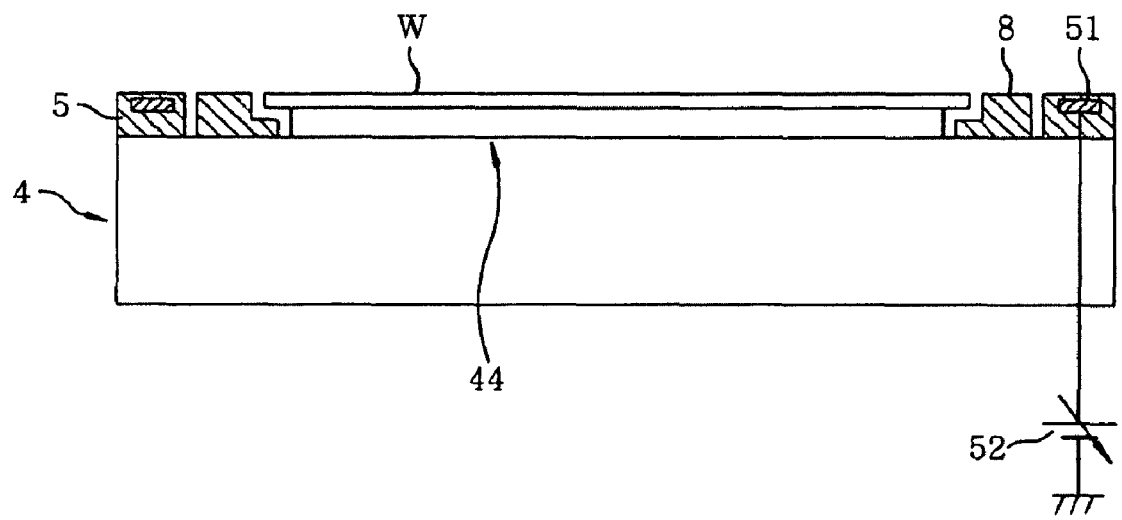
FIG. 5 provides an explanatory diagram of another embodiment of the present invention.
Figure 6:
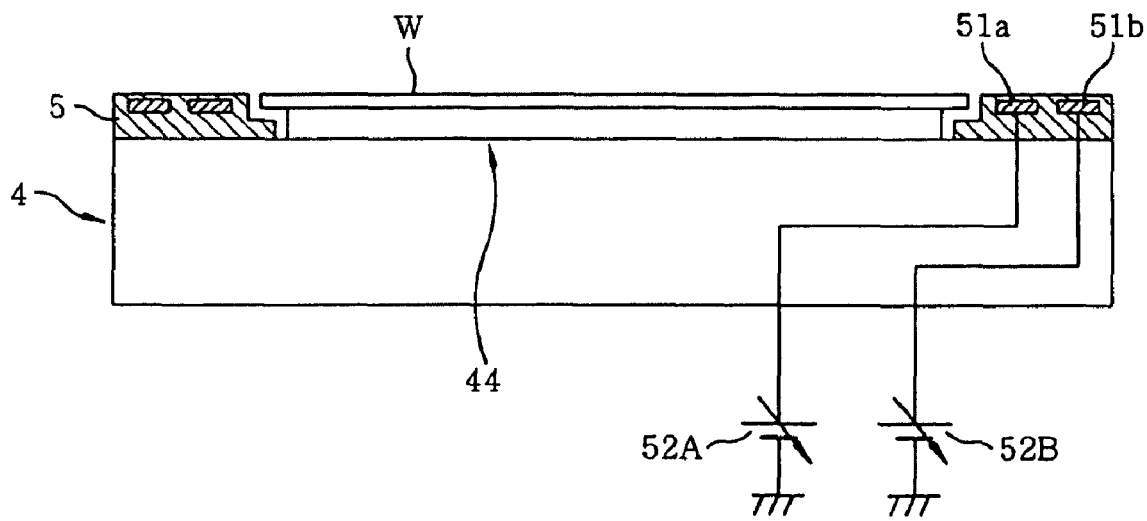
FIG. 6 presents an explanatory diagram of still another embodiment of the present invention.
Figure 7:
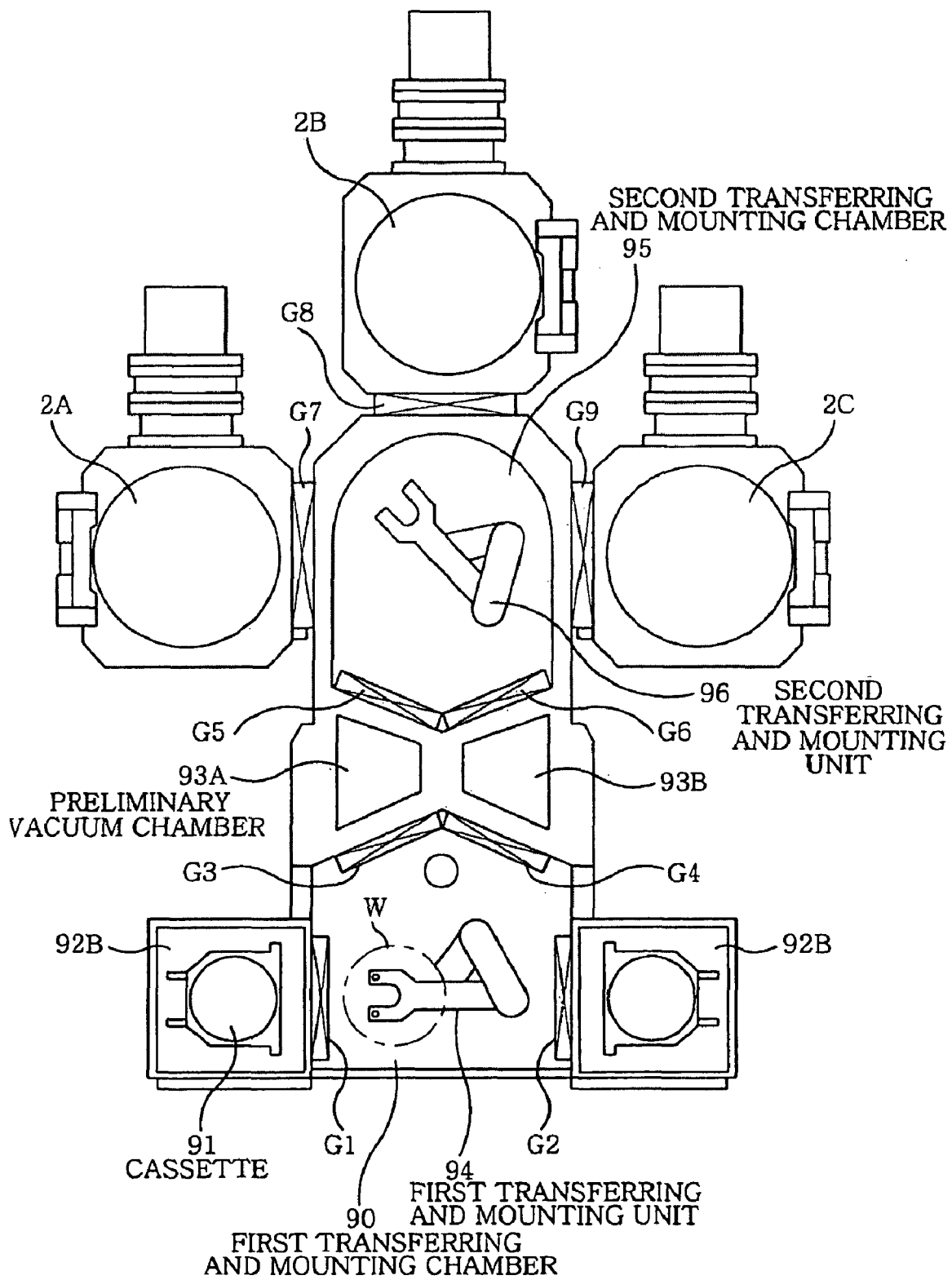
FIG. 7 depicts a plasma processing system including the plasma processing apparatus in accordance with an embodiment of the present invention.
Figure 8:
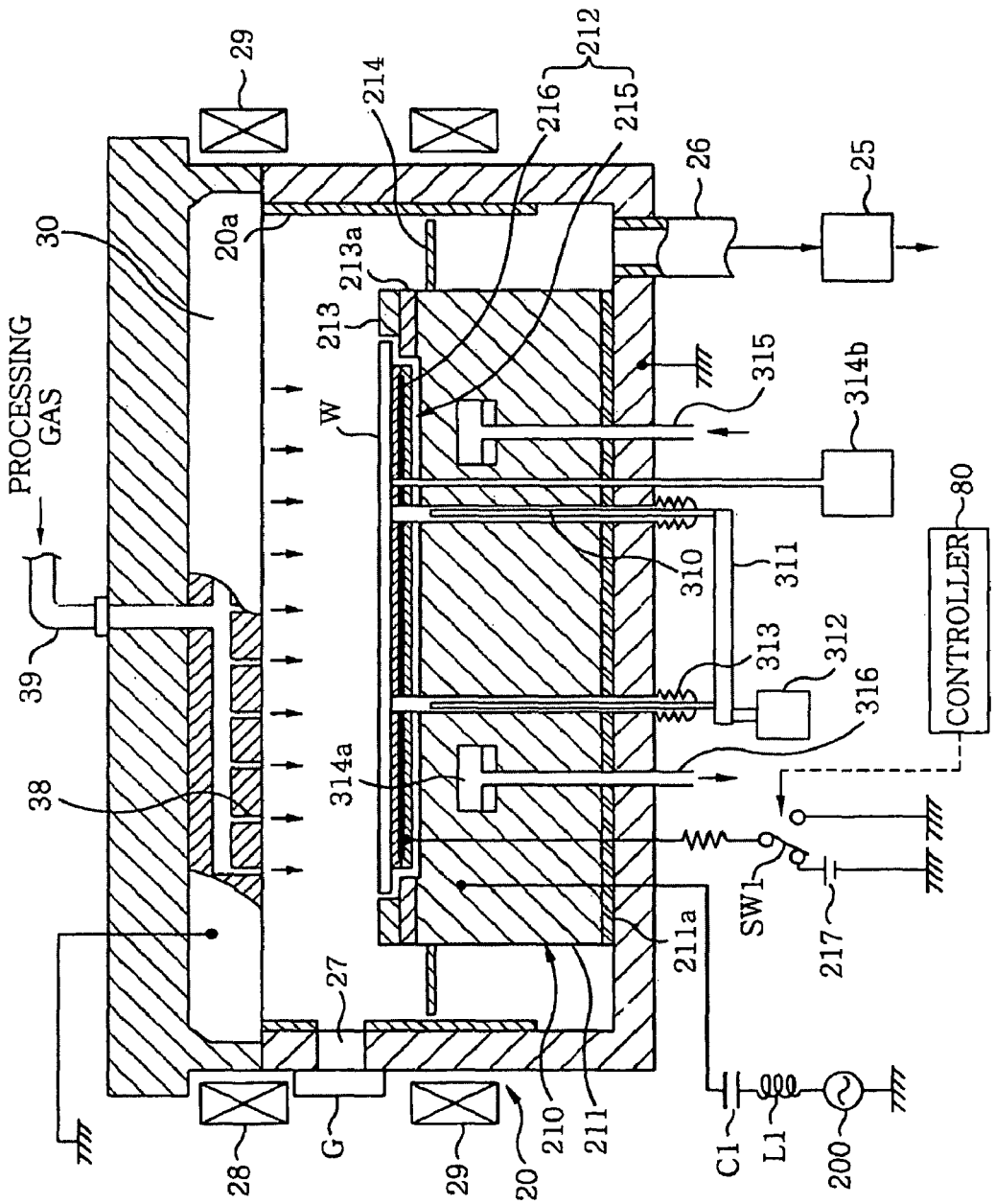
FIG. 8 represents a vertical cross-sectional view of a plasma processing apparatus mounted with a ring member in accordance with an embodiment of the present invention.
Figure 9:
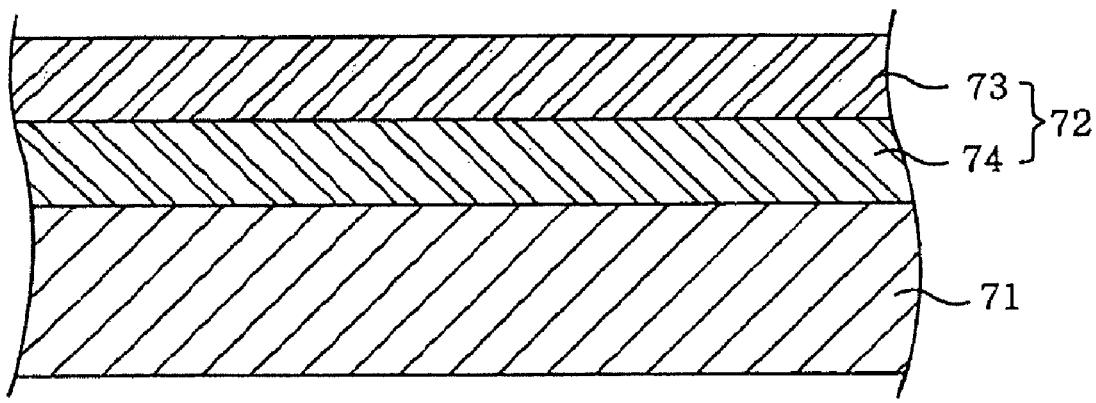
FIG. 9 depicts a cross-sectional view of a layer structure in a first example of the ring member in accordance with the present invention.
Figure 10:
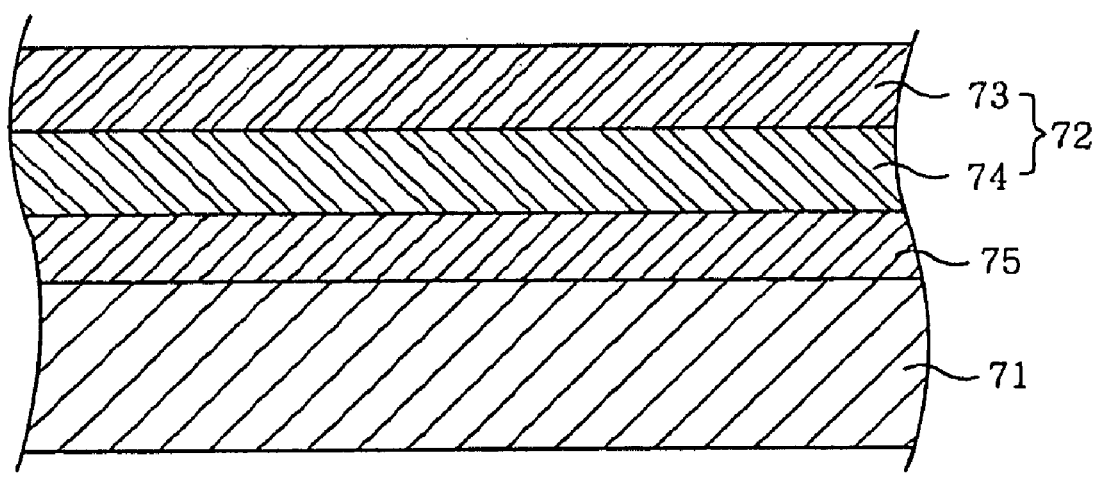
FIG. 10 sets forth a cross-sectional view of an example of adding an anodic oxidized film to the structure of FIG. 9.
Figure 11A:
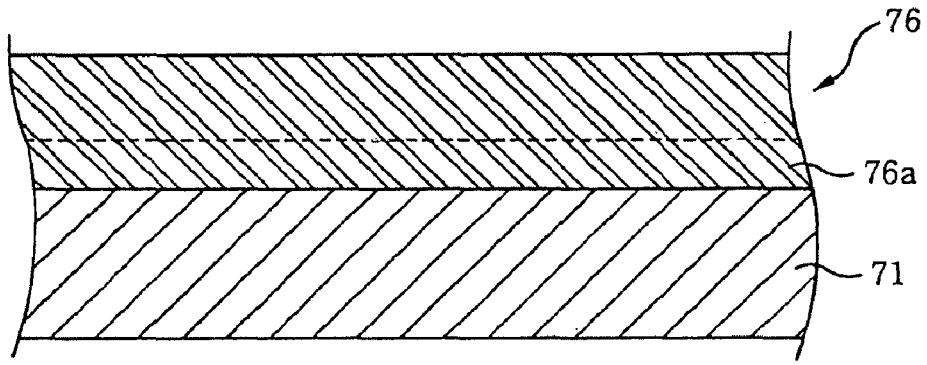
FIGS. 11A to 11C show cross-sectional views of layer structures in a second example of the ring member in accordance with an embodiment of the present invention.
Figure 11B:
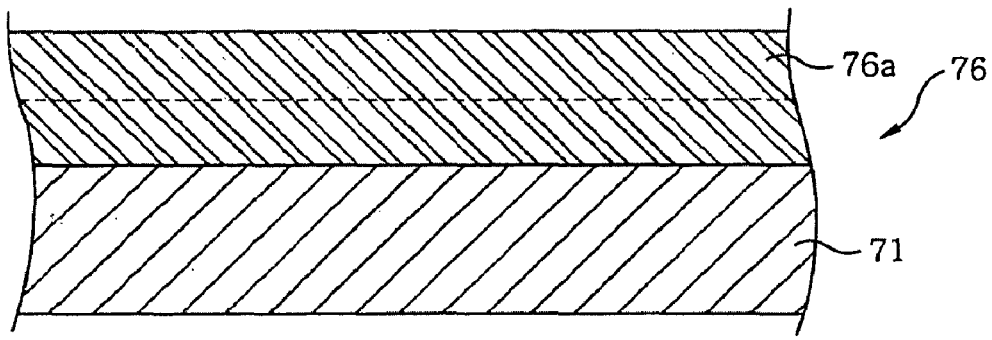
Figure 11C:
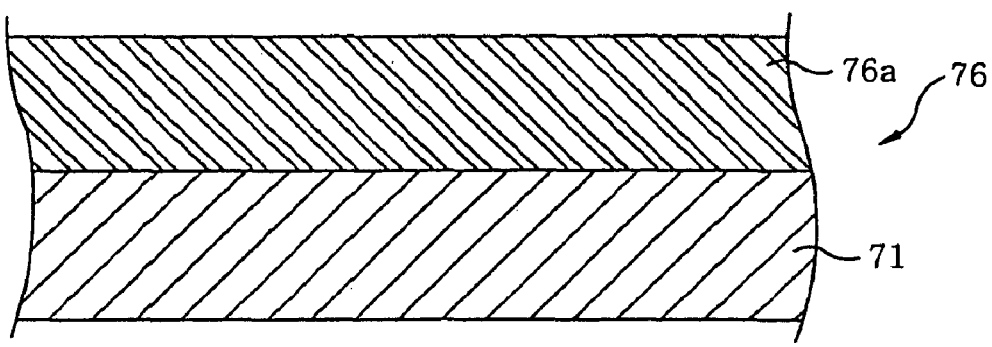
Figure 12:
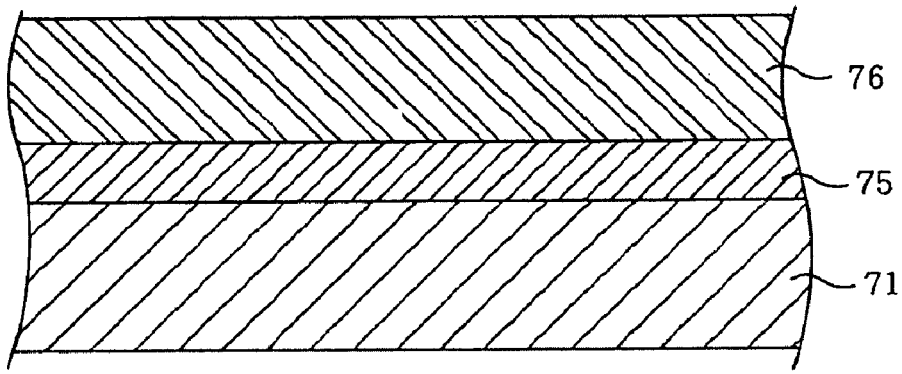
FIG. 12 illustrates a cross-sectional view of an example of adding the anodic oxidized film to the structures of FIGS. 11A to 11C.
Figure 13A:
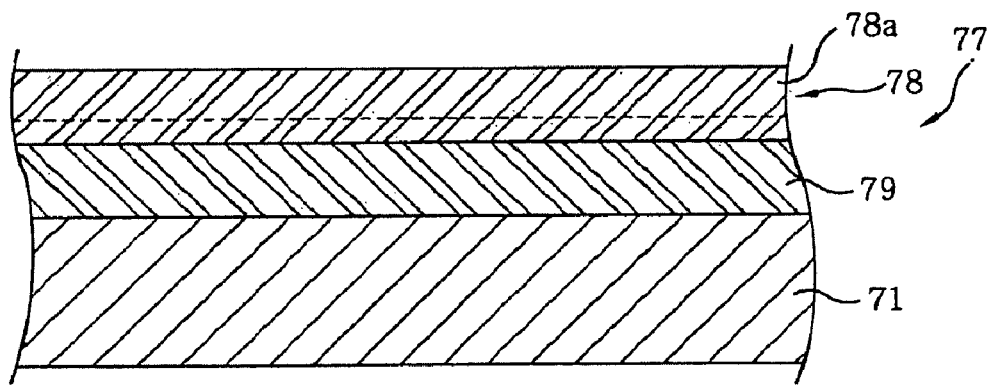
FIGS. 13A and 13B describe cross-sectional views of layer structures in a third example of the ring member in accordance with the embodiment of the present invention.
Figure 13B:
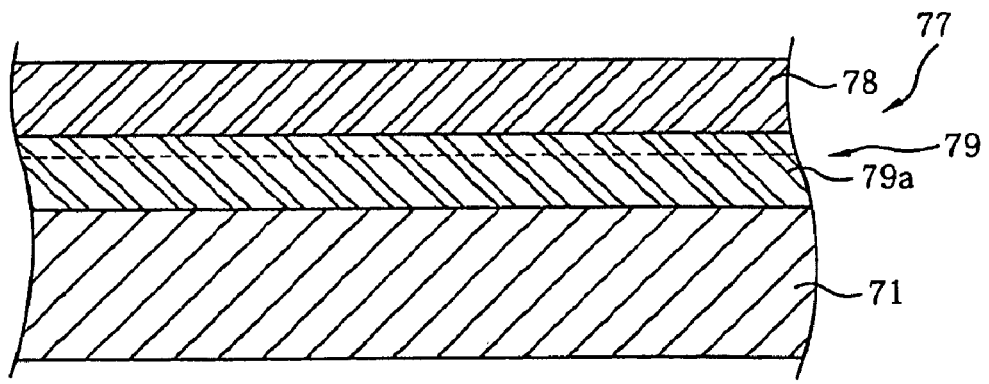
Figure 14:
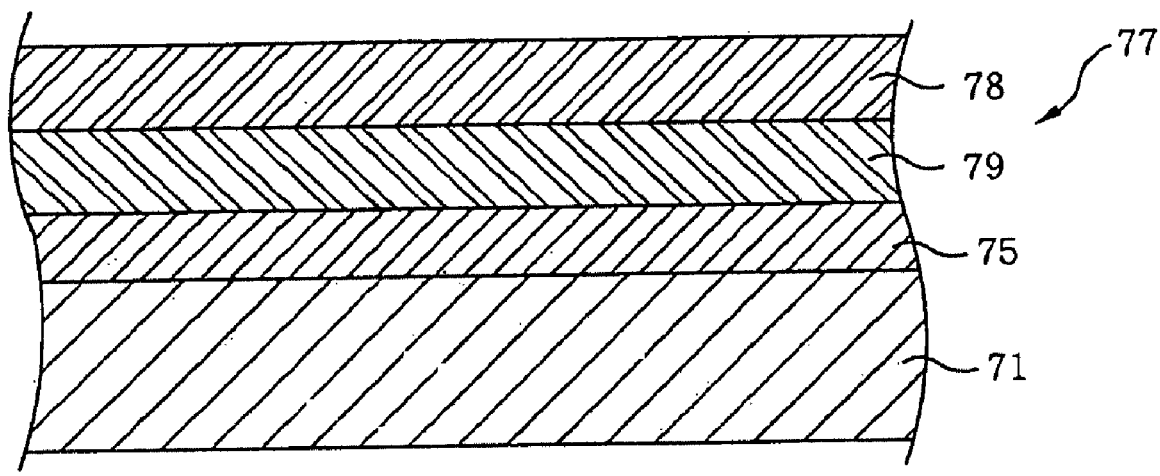
FIG. 14 offers a cross-sectional view of an example of adding the anodic oxidized film to the structures of FIGS. 13A and 13B.
Figure 15:
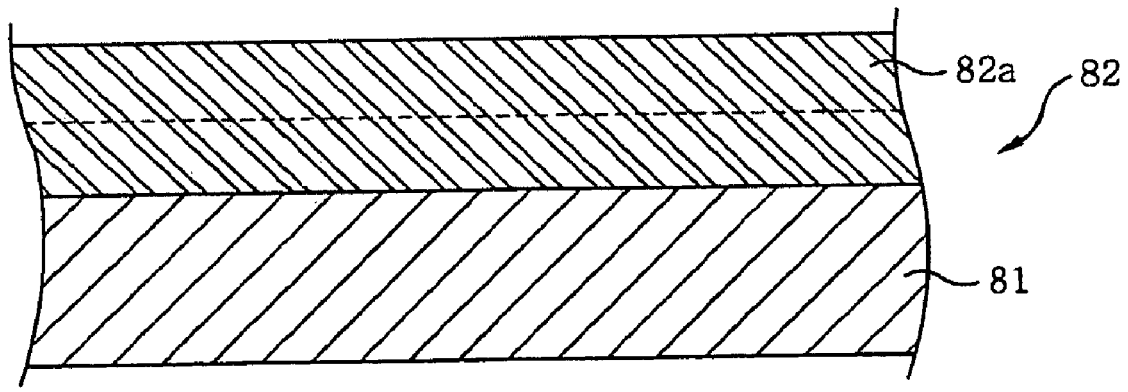
FIG. 15 provides a cross-sectional view of a layer structure in a first example of the ring member in accordance with the embodiment of the present invention.
Figure 16A:
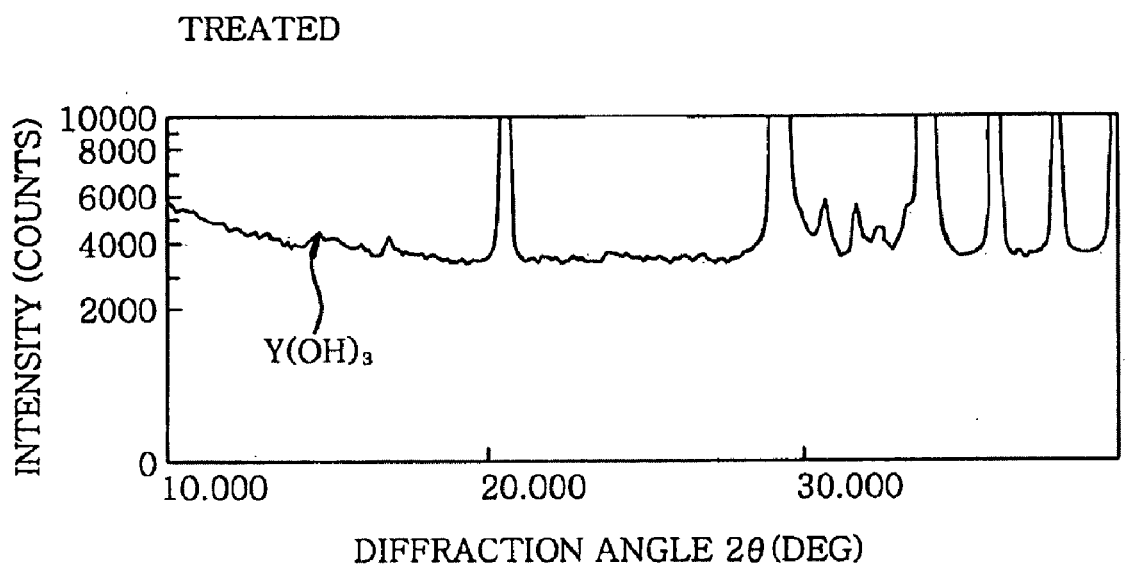
FIGS. 16A and 16B present patterns of X-ray analysis when hydration treatment is executed on a $Y_2O_3$ film and when the hydration treatment is not executed on the $Y_2O_3$ film.
Figure 16B:
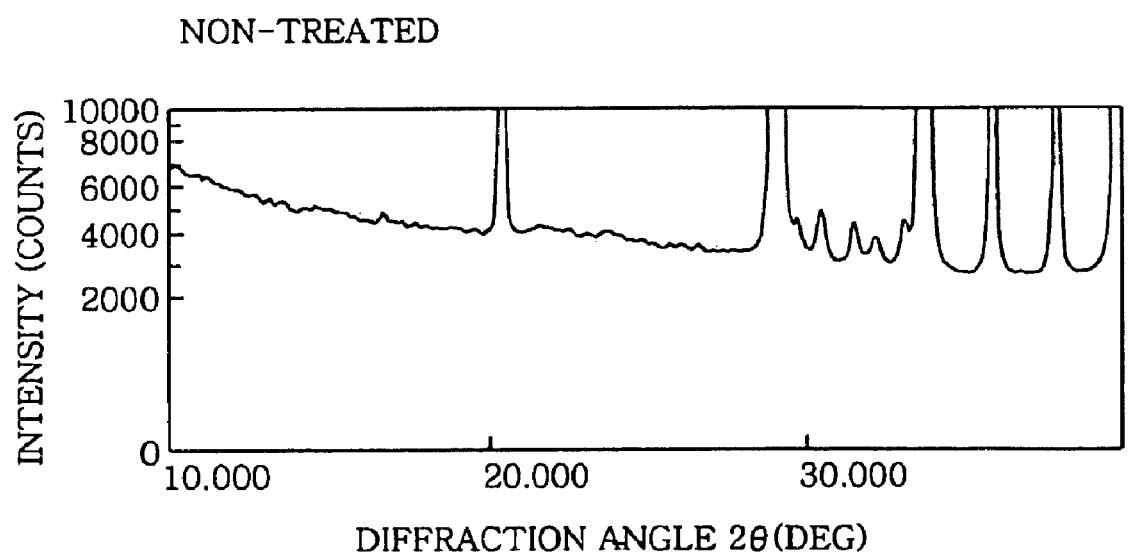
Figure 17:
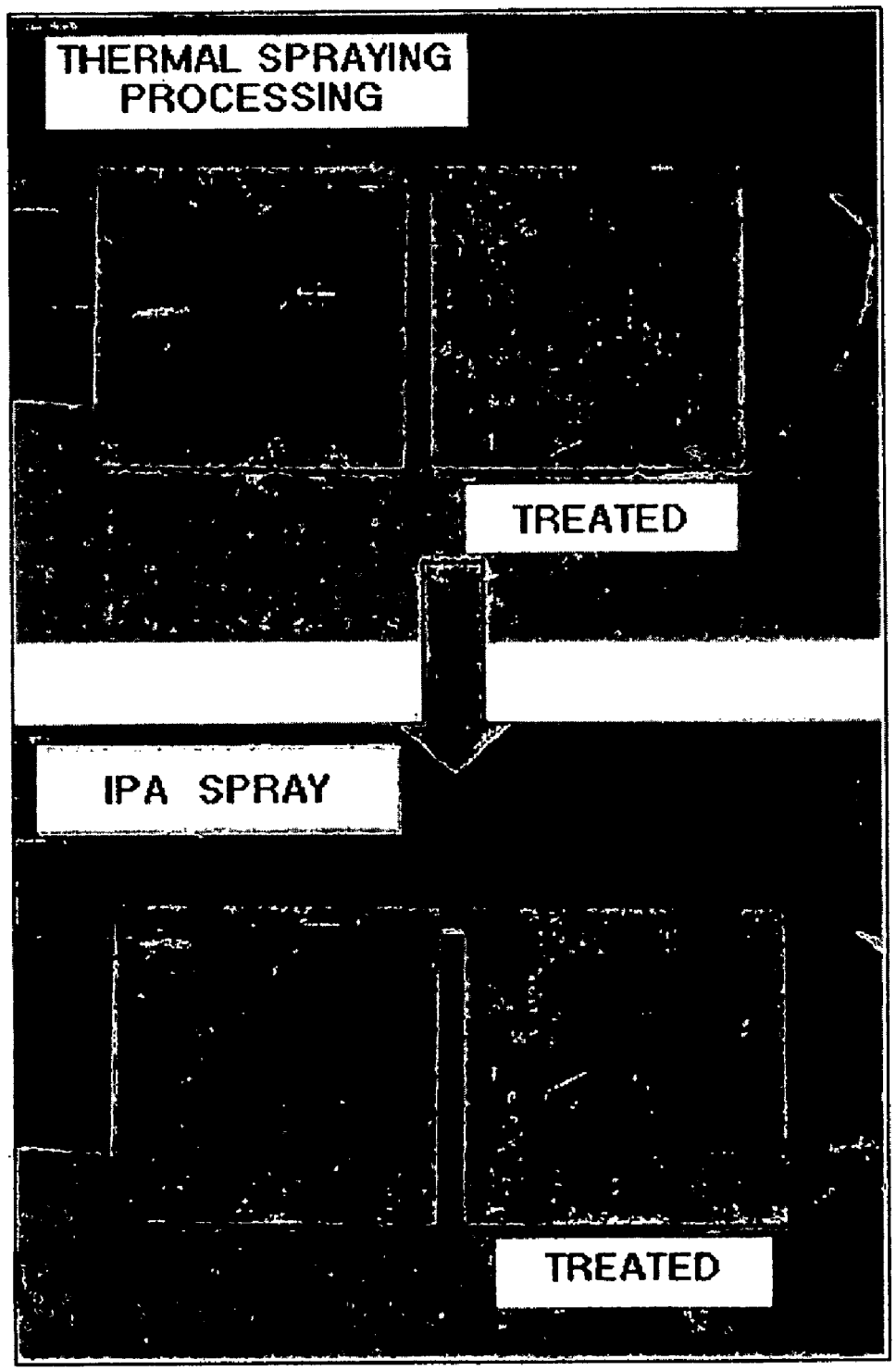
FIG. 17 depicts adsorption of IPA when the hydration treatment is executed on the $Y_2O_3$ film and when the hydration treatment is not executed on the $Y_2O_3$ film.
Figure 18A:
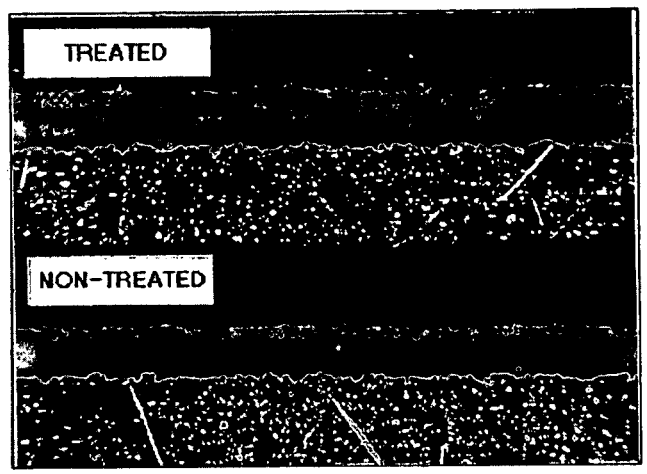
FIGS. 18A to 18C illustrate infiltrations of resin when the hydration treatment is executed on the $Y_2O_3$ film and when the hydration treatment is not executed on the $Y_2O_3$ film.
Figure 18B:
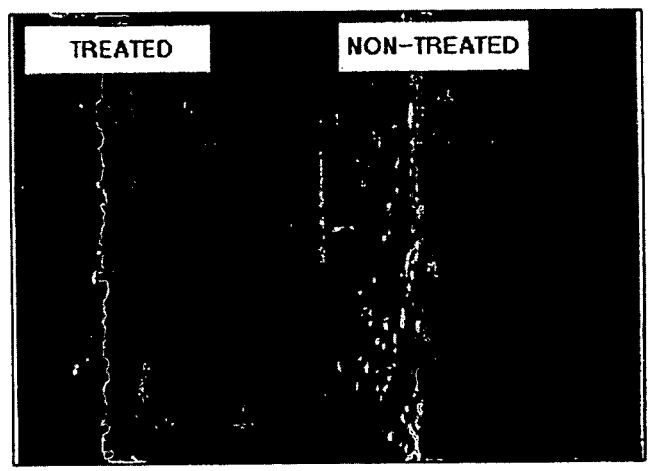
Figure 18C:
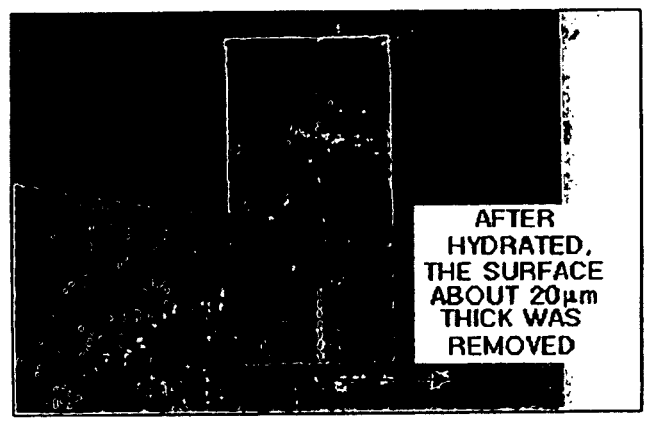
Figure 19A:
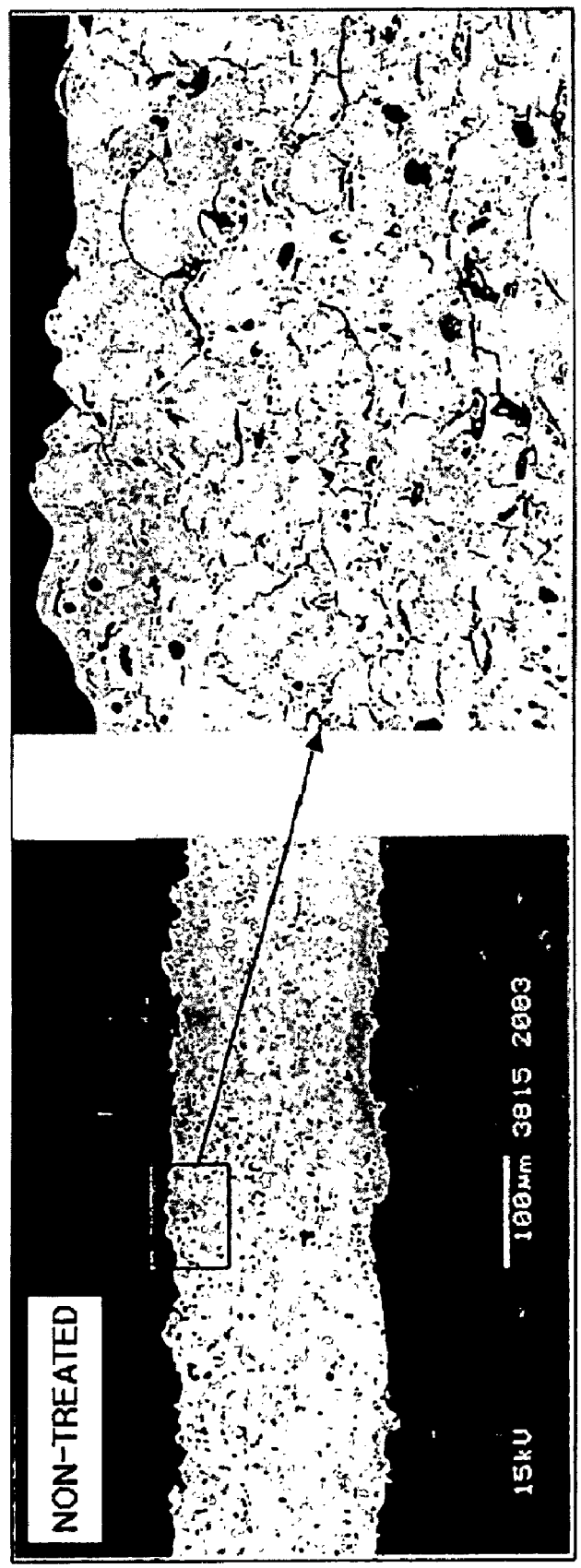
FIGS. 19A and 19B are photographs of a scanning electron microscope showing layer states before the hydration treatment and after the hydration treatment.
Figure 19B:
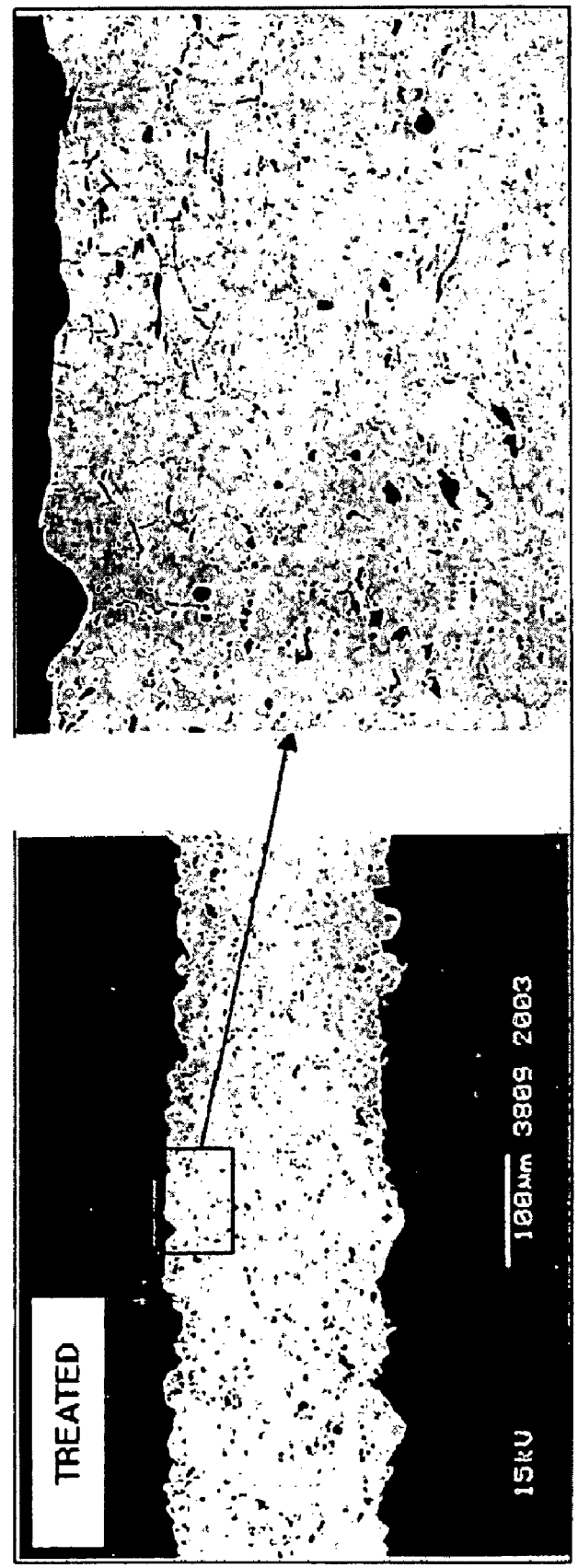
Figure 20:
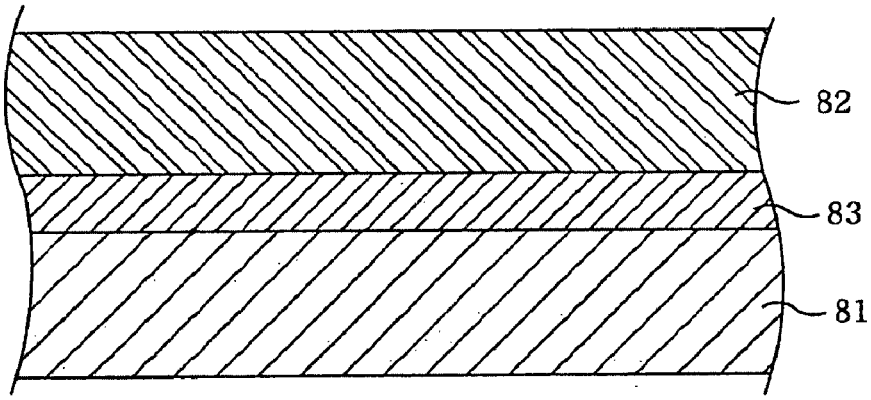
FIG. 20 describes a cross-sectional view of an example of adding an anodic oxidized film to the structure of FIG. 15.
Figure 21A:
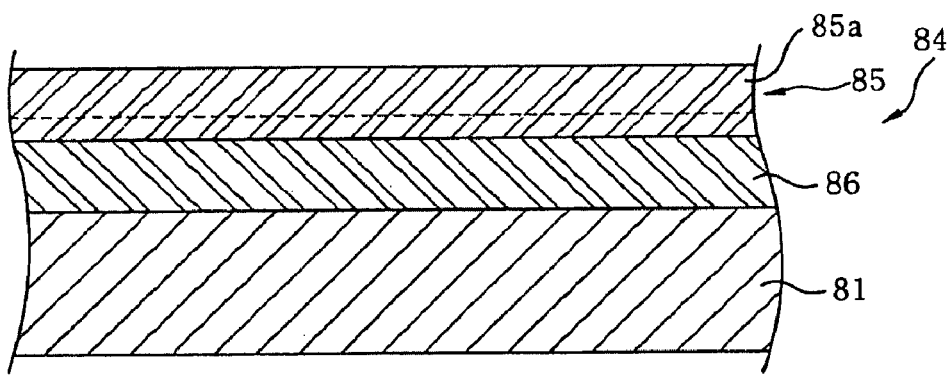
FIGS. 21A and 21B offer cross-sectional views of layer structures in a second example of the ring member in accordance with an embodiment of the present invention.
Figure 21B:
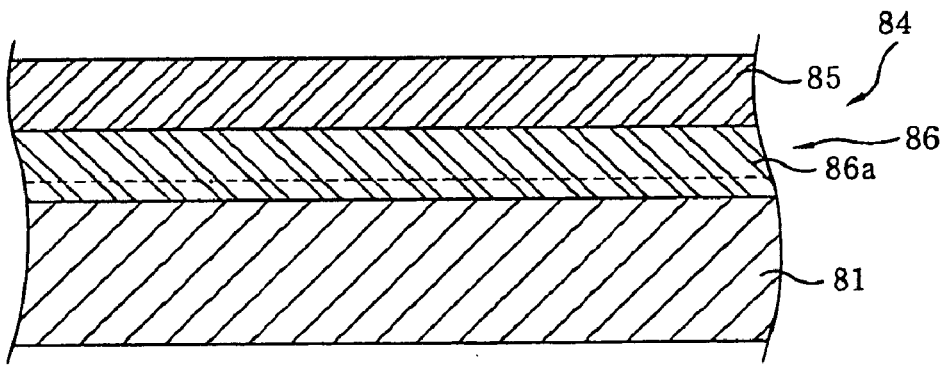
Figure 22:
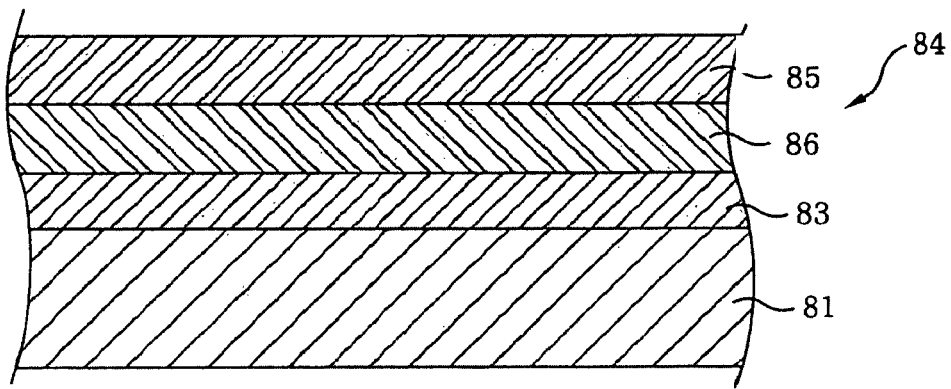
FIG. 22 provides a cross-sectional view of an example of adding the anodic oxidized film to the structure of FIG. 21A or 21B.
Figure 23:
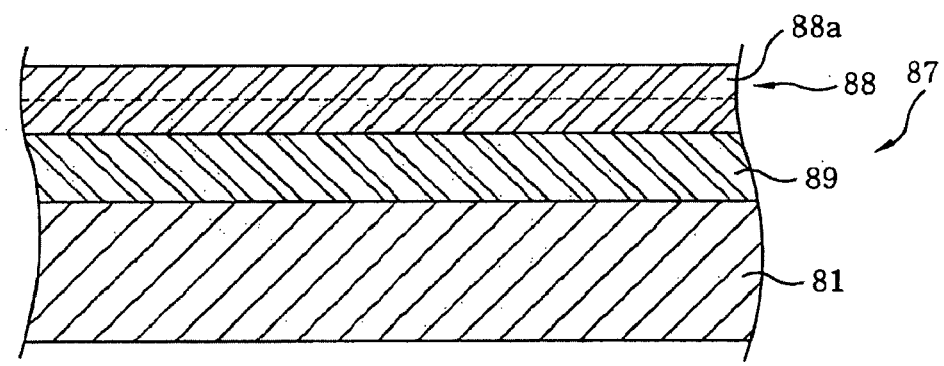
FIG. 23 presents a cross-sectional view of a layer structure in a third example of the ring member in accordance with an embodiment of the present invention.
Figure 24:
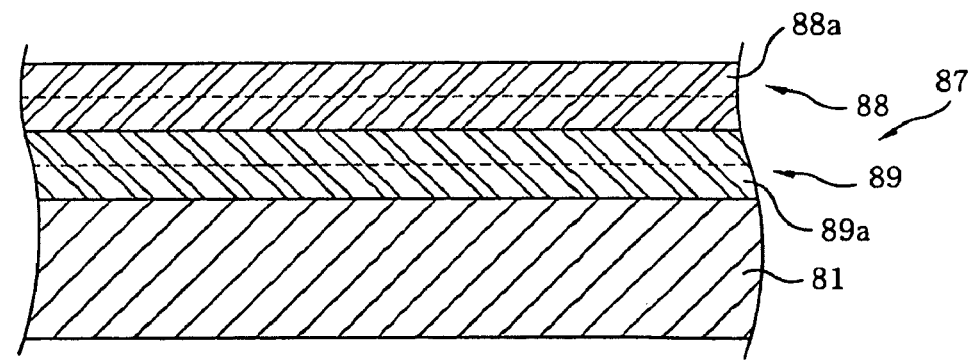
FIG. 24 depicts a cross-sectional view of another layer structure in the third example of the ring member in accordance with an embodiment of the present invention.
Figure 25:
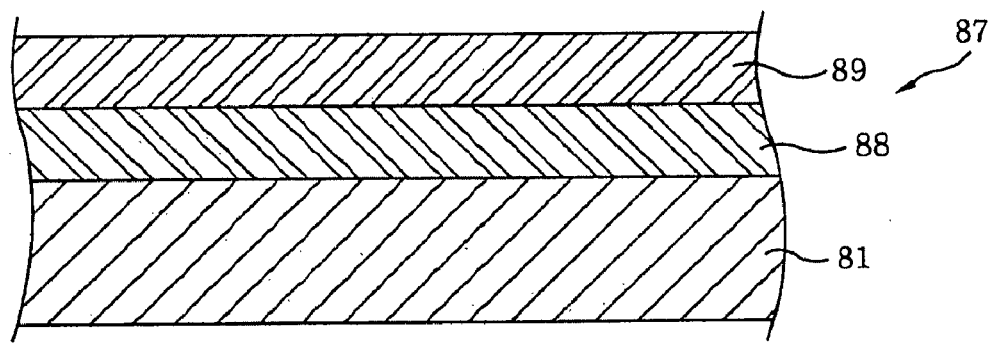
FIG. 25 represents a cross-sectional view of still another layer structure in the third example of the ring member in accordance with an embodiment of the present invention.
Figure 26:
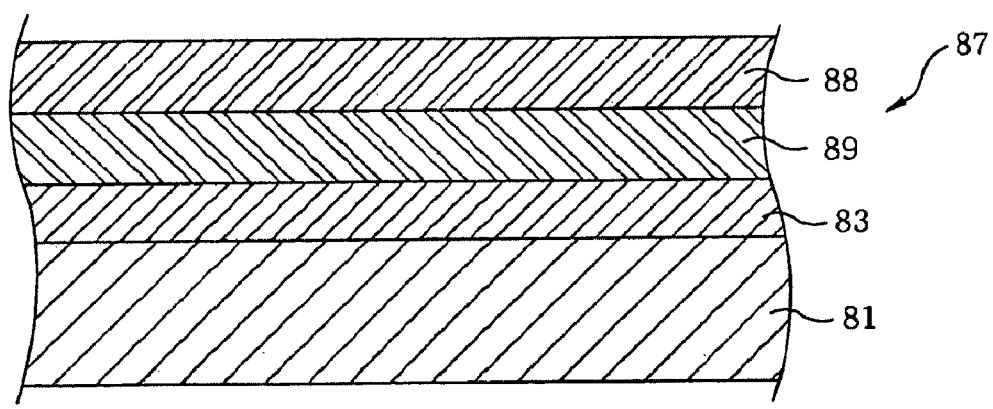
FIG. 26 sets forth a cross-sectional view of an example of adding the anodic oxidized film to the structure of FIG. 16.
Figure 27:
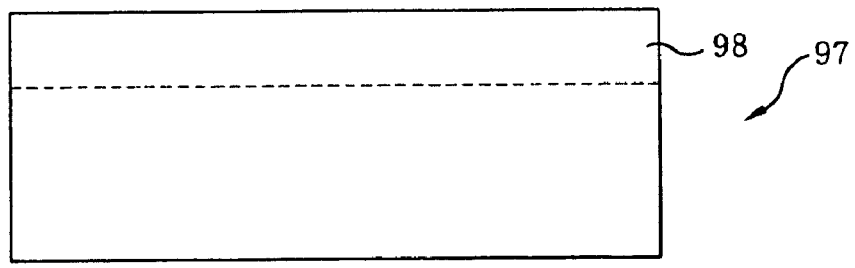
FIG. 27 illustrates a schematic diagram of the ring member in accordance with an embodiment of the present invention.
Figure 28:
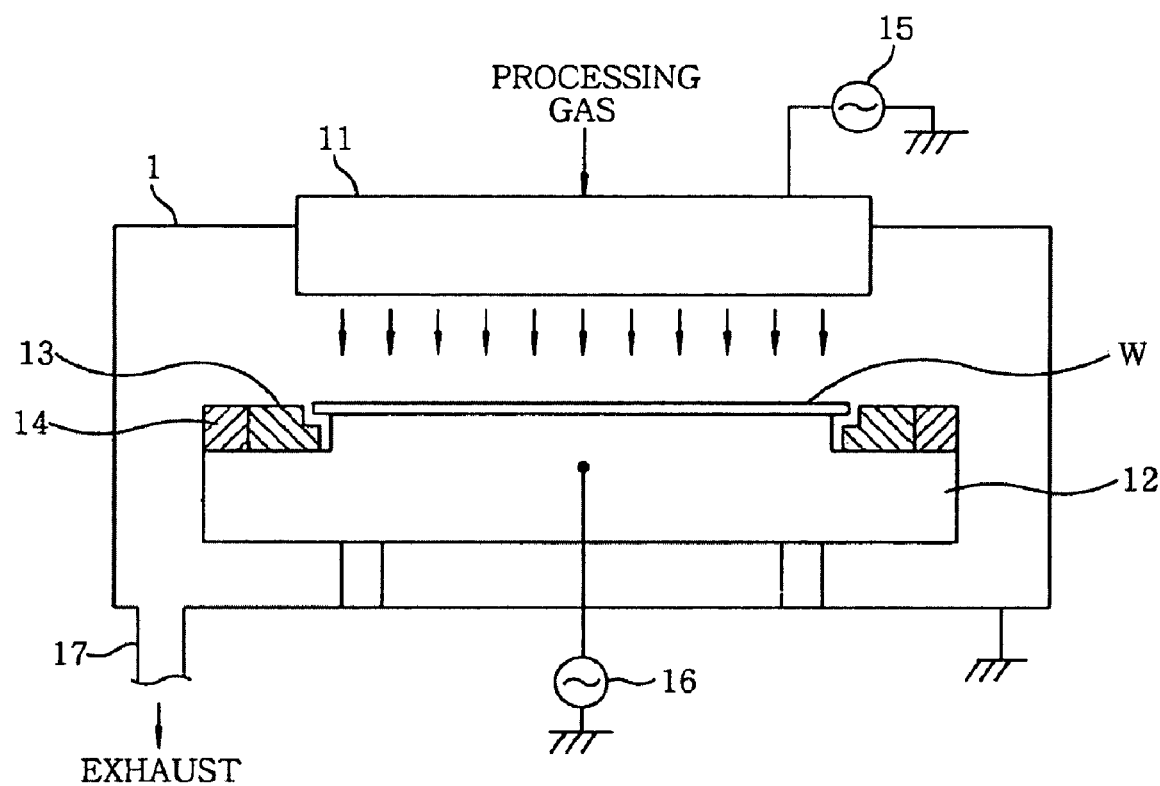
FIG. 28 is an explanatory drawing of a conventional plasma processing apparatus.

REFERENCE CHARACTERS 2 processing vessel
22 vacuum pump
3 upper electrode
33 first gas supplying system
34 second gas supplying system
4 lower electrode
44 electrostatic chuck
5 focus ring
51 electrode
52a actuator
6 controller
20 vacuum chamber
20a deposition shield
30 gas shower head
210 mounting table
212 electrostatic chuck
213 focus ring
214 exhaust plate
71, 81 base material
72, 76, 77, 82, 84, 87 film
74 barrier coat layer
75, 83 anodic oxidized film
76a, 78a, 79a sealing-treated portion
82a, 86a, 88a, 98 hydration-treated portion

What is claimed is:

1. A plasma etching method for use in a plasma processing apparatus for performing an etching processing on a substrate mounted on a mounting table in a processing vessel by plasma of a processing gas, wherein the plasma processing apparatus comprises: a ring member formed of an insulating material, installed to surround the substrate on the mounting table; and a DC power supply, the plasma etching method comprising the steps of:

mounting the substrate on the mounting table in the processing vessel;

executing a first etching process on an insulating layer of the substrate by generating plasma in the processing vessel under a condition in which a first DC voltage is applied to an electrode embedded inside the ring member along a diametrical direction thereof; and executing a second etching process on a silicon layer of the substrate by generating plasma in the processing vessel under a condition in which a second DC voltage is applied to the electrode, wherein the DC power supply applies the first DC voltage and the second DC voltage to the electrode to adjust a plasma sheath region above the ring member.

2. The plasma etching method of claim 1, wherein an inner ring member formed of a conductive material is disposed between the substrate and the ring member, and the inner ring member is installed to surround the substrate on the mounting table and spaced apart from an outer periphery of the substrate.

3. The plasma etching method of claim 1, wherein the plasma processing apparatus further comprises additional electrodes embedded inside the ring member and one or more additional DC power supplies, and
wherein the DC power supply and the additional DC power supplies supply independently adjusted DC voltages to the electrode and the additional electrodes.

4. The plasma etching method of claim 1, wherein the first DC voltage is higher than the second DC voltage.

5. The plasma etching method of claim 1, wherein the ring member includes:
a base material; and
a film formed by thermal spraying of ceramic on a surface of the base material, and
wherein the film is formed of ceramic including at least one kind of element selected from the group consisting of B, Mg, Al, Si, Ca, Cr, Y, Zr, Ta, Ce and Nd, and at least a portion of the film is sealed by a sol-gel method.

6. The plasma etching method of claim 5, wherein a sealing treatment is executed by using an element selected from elements in the Group 3a of the periodic table.

7. The plasma etching method of claim 1, wherein the ring member includes:
a base material; and
a film formed by thermal spraying of ceramic on a surface of the base material, and
wherein the film is formed of ceramic including at least one kind of element selected from the group consisting of B, Mg, Al, Si, Ca, Cr, Y, Zr, Ta, Ce and Nd, and at least a portion of the film is sealed by a resin.

8. The plasma etching method of claim 7, wherein the resin is selected from the group consisting of SI, PTFE, PI, PAI, PEI, PBI and PFA.

9. The plasma etching method of claim 7, wherein the ceramic is at least one kind selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

10. The plasma etching method of claim 1, wherein the ring member includes:
a base material; and
a film formed on a surface of the base material, and
wherein the film has a main layer formed by thermal spraying of ceramic and a barrier coat layer formed of ceramic including an element selected from the group consisting of B, Mg, Al, Si, Ca, Cr, Y, Zr, Ta, Ce and Nd.

11. The plasma etching method of claim 10, wherein the barrier coat layer is formed of at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

12. The plasma etching method of claim 10, wherein the barrier coat layer is a thermally sprayed film at least a portion of which is sealed by a resin.

13. The plasma etching method of claim 12, wherein the resin is selected from the group consisting of SI, PTFE, PI, PAI, PEI, PBI and PFA.

14. The plasma etching method of claim 10, wherein the barrier coat layer is a thermally sprayed film at least a portion of which is sealed by a sol-gel method.

15. The plasma etching method of claim 14, wherein a sealing treatment is performed by using an element selected from elements in the Group 3a of the periodic table.

16. The plasma etching method of claim 1, wherein the ring member includes:
a base material; and
a film formed on a surface of the base material, and
wherein the film has a main layer formed by thermal spraying of ceramic and a barrier coat layer formed of engineering plastic formed between the base material and the main layer.

17. The plasma etching method of claim 16, wherein the engineering plastic is a plastic selected from the group consisting of PTFE, PI, PAI, PEI, PBI, PFA, PPS, and POM.

18. The plasma etching method of claim 16, wherein the main layer is formed of at least one kind of ceramic selected from the group consisting of $B_4C$, MgO, $Al_2O_3$, SiC, $Si_3N_4$, $SiO_2$, $CaF_2$, $Cr_2O_3$, $Y_2O_3$, $YF_3$, $ZrO_2$, $TaO_2$, $CeO_2$, $Ce_2O_3$, $CeF_3$ and $Nd_2O_3$.

* * * * *